(12) United States Patent
Tanizawa et al.

(10) Patent No.: US 10,854,481 B2
(45) Date of Patent: Dec. 1, 2020

(54) SUBSTRATE PROCESSING METHOD AND SUBSTRATE PROCESSING APPARATUS

(71) Applicant: SCREEN Holdings Co., Ltd., Kyoto (JP)

(72) Inventors: Shigeki Tanizawa, Kyoto (JP); Nobuyuki Miyaji, Kyoto (JP); Makoto Takaoka, Kyoto (JP); Naoki Sawazaki, Kyoto (JP); Tsuyoshi Okumura, Kyoto (JP); Atsuyasu Miura, Kyoto (JP)

(73) Assignee: SCREEN Holdings Co., Ltd.

( * ) Notice: Subject to any disclaimer, the term of this patent is extended or adjusted under 35 U.S.C. 154(b) by 189 days.

(21) Appl. No.: 16/041,919

(22) Filed: Jul. 23, 2018

(65) Prior Publication Data

US 2019/0067047 A1    Feb. 28, 2019

(30) Foreign Application Priority Data

Aug. 31, 2017   (JP) ................................. 2017-167680

(51) Int. Cl.
*H01L 21/67*  (2006.01)

(52) U.S. Cl.
CPC .... *H01L 21/67051* (2013.01); *H01L 21/6708* (2013.01); *H01L 21/67028* (2013.01); *H01L 21/67034* (2013.01)

(58) Field of Classification Search
CPC ......... H01L 21/67051; H01L 21/67028; H01L 21/67034; H01L 21/6708
See application file for complete search history.

(56) References Cited

U.S. PATENT DOCUMENTS

| 2007/0017555 | A1 | 1/2007 | Sekiguchi et al. ............. 134/33 |
| 2007/0223342 | A1* | 9/2007 | Orii .................... H01L 21/02052 |
| | | | 369/69 |
| 2009/0101181 | A1 | 4/2009 | Morisawa et al. ........... 134/94.1 |
| 2013/0133695 | A1 | 5/2013 | Minami et al. ................. 134/18 |
| 2014/0352737 | A1 | 12/2014 | Ookouchi et al. ............. 134/30 |

(Continued)

FOREIGN PATENT DOCUMENTS

| JP | 2007-036180 A | 2/2007 |
| JP | 2012-099862 A | 5/2012 |

(Continued)

*Primary Examiner* — Sharidan Carrillo
(74) *Attorney, Agent, or Firm* — Ostrolenk Faber LLP

(57) ABSTRACT

A substrate processing method includes holding a substrate horizontally, supplying water-containing processing liquid to an upper surface of the substrate, forming a low surface tension liquid film, covering the upper surface by supplying that liquid to the substrate's upper surface, supplying a gas to a center region of the liquid film to form an opening in the center, widening the opening in order to remove the film, rotating the substrate around a predetermined rotational axis along a vertical direction, blowing, in the opening widening step, the gas toward a gas supply position that is set further inward than a peripheral edge of the opening on the upper surface of the substrate, and moving the gas supply position toward the peripheral edge of the upper surface of the substrate, and supplying, the low surface tension liquid toward a liquid landing position that is set further outward and moving the liquid landing position toward the peripheral edge of the upper surface of the substrate.

10 Claims, 16 Drawing Sheets

(56) References Cited

U.S. PATENT DOCUMENTS

| | | | |
|---|---|---|---|
| 2015/0083167 A1 | 3/2015 | Yoshizumi et al. | 134/26 |
| 2015/0325458 A1* | 11/2015 | Printz | H01L 21/67028 |
| | | | 134/30 |
| 2016/0096203 A1* | 4/2016 | Kai | H01L 21/6708 |
| | | | 134/30 |
| 2016/0372320 A1 | 12/2016 | Emoto | |
| 2017/0182515 A1* | 6/2017 | Emoto | H01L 21/67051 |
| 2017/0186599 A1 | 6/2017 | Takahashi et al. | |
| 2019/0035652 A1* | 1/2019 | Hashimoto | H01L 21/67028 |
| 2019/0096706 A1* | 3/2019 | Kai | H01L 21/67051 |

FOREIGN PATENT DOCUMENTS

| | | | | |
|---|---|---|---|---|
| JP | 2013-115370 A | 6/2013 | | |
| JP | 2013-131783 A | 7/2013 | | |
| JP | 5390873 B2 | 1/2014 | | |
| JP | 2015-088737 A | 5/2015 | | |
| JP | 2015-115584 A | 6/2015 | | |
| JP | 2016-021597 A | 2/2016 | | |
| JP | 2017-069346 A | 4/2017 | | |
| JP | 2017162916 * | 9/2017 | | H01L 21/304 |
| KR | 10-2016-0148466 A | 12/2016 | | |
| KR | 10-2017-0076594 A | 7/2017 | | |
| TW | 201519966 A | 6/2015 | | |
| TW | 201628114 A | 8/2016 | | |
| WO | WO-2017154599 A1 * | 9/2017 | | H01L 21/67034 |

\* cited by examiner

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus for processing substrates. Examples of substrates to be processed include substrates, such as semiconductor wafers, substrates for liquid crystal displays, substrates for FPDs (flat panel displays), such as organic EL (electroluminescence) display devices, etc., substrates for optical disks, substrates for magnetic disks, substrates for magneto-optical disks, substrates for photomasks, ceramic substrates, substrates for solar cells, etc.

2. Description of the Related Art

In substrate processing by a single substrate processing type substrate processing apparatus, substrates are processed one by one. Specifically, the substrate is held approximately horizontally using a spin chuck. Then, after the upper surface of the substrate is processed with a chemical liquid, the upper surface of the substrate is rinsed by a rinse liquid. The substrate is then subjected to a spin drying step of rotating the substrate at high speed to dry the upper surface of the substrate.

As shown in FIG. 14, when a fine pattern is formed on the front surface of a substrate, it may be impossible, in the spin drying step, to remove the rinse liquid that has entered into the interior of the pattern. Drying defects may thereby be produced. A liquid surface of the rinse liquid that has entered into the interior of the pattern (an interface between the air and the liquid) is formed inside the pattern. Consequently, surface tension acts on the liquid at the positions where the liquid surface and the pattern are in contact. If the surface tension is high, the pattern becomes more likely to collapse. Water, a typical rinse liquid, has a high surface tension and therefore collapse of the pattern in the spin drying step cannot be disregarded.

Accordingly, a technique of using isopropyl alcohol (IPA), which is a low surface tension liquid with lower surface tension than water, have been proposed (see Japanese Patent Application Publication No. 2016-21597, for example).

SUMMARY OF THE INVENTION

In the substrate processing described in Japanese Patent Application Publication No. 2016-21597, after the rinse liquid on the substrate has been replaced with IPA, a liquid film of IPA formed on the substrate is removed off from the substrate by centrifugal force. In detail, a circular opening is formed in the center region of the IPA liquid film on the substrate, and, due to widening of the opening, the IPA is removed from the substrate. Because of the relatively high volatility of IPA, due to evaporation, the IPA liquid film tends to be thin. When the IPA liquid film becomes thin near the opening, the opening may fail to widen at a uniform speed (maintaining a circular shape) across the entire region in the direction of rotation. In detail, as a part of the peripheral edge of the opening radially extends toward the peripheral edge of the substrate, disruption of the liquid film may occur. IPA droplets may thereby remain on the upper surface of the substrate partially. Until the droplets finally evaporate, the liquid surface of the IPA (which may include trace amounts of moisture dissolved in the IPA) continues to exert surface tension on the pattern. Collapse of the pattern may thereby occur.

It is therefore an object of the present invention to provide a substrate processing method and a substrate processing apparatus that can satisfactorily remove low surface tension liquid on the substrate.

The present invention provides a substrate processing method including a substrate holding step of holding a substrate horizontally, a processing liquid supply step of supplying a water-containing processing liquid to an upper surface of the substrate, a liquid film forming step of forming a liquid film of a low surface tension liquid, having a lower surface tension than water, that covers the upper surface, by supplying the low surface tension liquid to the upper surface of the substrate to replace the processing liquid on the substrate with the low surface tension liquid, an opening forming step of supplying a gas to a center region of the liquid film to form an opening in the center region of the liquid film, an opening widening step of widening the opening in order to remove the liquid film, a substrate rotating step of rotating, in the opening widening step, the substrate around a predetermined rotational axis along a vertical direction, a gas supply position moving step of blowing, in the opening widening step, the gas toward a gas supply position that is set further inward than a peripheral edge of the opening on the upper surface of the substrate, and moving the gas supply position toward the peripheral edge of the upper surface of the substrate, and a liquid landing position moving step of supplying, in the opening widening step, the low surface tension liquid toward a liquid landing position that is set further outward than the peripheral edge of the opening on the upper surface of the substrate, and moving the liquid landing position toward the peripheral edge of the upper surface of the substrate.

According to this method, the substrate rotating step, the gas supply position moving step, and the liquid landing position moving step are carried out, when the opening formed in the liquid film of the low surface tension liquid is widened to remove the liquid film from the substrate.

Due to rotation of the substrate during widening of the opening, centrifugal force acts on the liquid film, and the liquid film is extruded out of the substrate. In the gas supply position moving step, the gas supply position that is set further inward than the peripheral edge of the opening moves toward the peripheral edge of the upper surface of the substrate. Therefore, the blowing force of the gas acts on the inner peripheral edge of the liquid film during widening of the opening. The blowing force of the gas is the force that acts due to blowing of the gas. When the blowing force of the gas acts on the inner peripheral edge of the liquid film, the liquid film is more reliably extruded out of the substrate. Consequently, residue of droplets of the low surface tension liquid in the region further inward than the peripheral edge of the opening is suppressed. That is, the region further inward than the peripheral edge of the opening can be satisfactorily dried.

On the other hand, the centrifugal force and blowing force may increase the low surface tension liquid that is discharged out of the substrate, and the centrifugal force and blowing force may reduce the thickness of the liquid film near the opening. In the liquid landing position moving step, the liquid landing position that is set further outward than the peripheral edge of the opening moves toward the peripheral edge of the upper surface of the substrate. The thickness of the liquid film can therefore be adequately ensured. Consequently, thinning of the liquid film near the opening by centrifugal force and blowing force is suppressed. Consequently, the opening can be widened at a uniform speed across the entire region in the direction of rotation.

As described above, the region further inward than the peripheral edge of the opening can be satisfactorily dried while widening the opening at a uniform speed across the entire region in the direction of rotation. As a result, the low surface tension liquid on the substrate can be satisfactorily removed.

In a preferred embodiment of the present invention, the liquid landing position moving step includes a step of moving the liquid landing position while forming a liquid buildup at the inner peripheral edge of the liquid film by supply of the low surface tension liquid. The liquid buildup is a portion of the liquid film that is thicker than the other portions of the liquid film.

According to this method, the liquid landing position is moved in a state where the liquid buildup is formed at the inner peripheral edge of the liquid film by supply of the low surface tension liquid. The thickness of the liquid film can therefore be more adequately ensured near the peripheral edge of the opening.

In a preferred embodiment of the present invention, the substrate processing method further includes, in parallel with the opening forming step, a low surface tension liquid supply step of supplying the low surface tension liquid to the liquid film. The thickness of the liquid film can therefore be adequately ensured near the peripheral edge of the opening when forming the opening. Thus, even if the low surface tension liquid near the peripheral edge of the opening has been pushed away due to supply of the gas during formation of the opening, the thickness of the liquid film near the peripheral edge of the opening is adequately maintained.

In a preferred embodiment of the present invention, the substrate processing method further includes a gas supply continuing step of continuing supply of the gas while the opening widening step is carried out. Thus, blowing force can be made to continuously act on the liquid film during widening of the opening. Therefore, the region further inward than the peripheral edge of the opening can be even more satisfactorily dried.

When the peripheral edge of the opening approaches the peripheral edge of the upper surface of the substrate due to widening of the opening, the overall amount of the low surface tension liquid on the substrate is reduced. Consequently, when the peripheral edge of the opening approaches the peripheral edge of the upper surface of the substrate, the temperature of the liquid film tends to be lowered. The substrate is also less likely to be dried, due to lowering of the temperature of the liquid film. This may prevent satisfactory drying of the peripheral edge region of the upper surface of the substrate.

Therefore, in a preferred embodiment of the present invention, the substrate rotating step includes a rotation deceleration step of decelerating rotation of the substrate such that a rotational speed of the substrate when the peripheral edge of the opening is positioned in the peripheral edge region of the upper surface of the substrate is lower than the rotational speed of the substrate when the peripheral edge of the opening is positioned in the center region of the upper surface of the substrate.

According to this method, the liquid film can be increased in thickness when the peripheral edge of the opening has approached the peripheral edge of the upper surface of the substrate. Therefore, the decrease in the low surface tension liquid present on the substrate, that is caused when the peripheral edge of the opening approaches the peripheral edge of the upper surface of the substrate, can be suppressed. Thereby, the reduction in temperature of the liquid film, that is caused when the peripheral edge of the opening approaches the peripheral edge of the upper surface of the substrate, can be suppressed. Consequently, the peripheral edge region of the upper surface of the substrate can be satisfactorily dried.

In a preferred embodiment of the present invention, the rotation deceleration step includes a step of decelerating rotation of the substrate such that the rotational speed of the substrate decreases as the peripheral edge of the opening moves toward the peripheral edge of the upper surface of the substrate.

According to this method, the liquid film can be gradually increased in thickness as the peripheral edge of the opening approaches the peripheral edge of the upper surface of the substrate. Therefore, the decrease in the low surface tension liquid present on the substrate, that is caused when the peripheral edge of the opening approaches the peripheral edge of the upper surface of the substrate, can be suppressed, even when the peripheral edge of the opening is positioned in the region between the center region and the peripheral edge region. Consequently, change in the temperature of the liquid film can be suppressed, even when the position of the peripheral edge of the opening is at any position of the upper surface of the substrate. As a result, the opening can be satisfactorily widened over the entire region of the upper surface of the substrate. Therefore, the liquid film on the substrate can be satisfactorily removed.

When the low surface tension liquid lands on the liquid film, the low surface tension liquid may splash and adhere further onto the inner side of the upper surface of the substrate than the opening.

Therefore, in a preferred embodiment of the present invention, the gas supply position moving step includes a gas inclined discharge step of discharging the gas from the gas nozzle along an inclined direction that is inclined with respect to the vertical direction so as to approach the peripheral edge of the upper surface of the substrate as the inclined direction goes downward, and a gas nozzle moving step of moving the gas supply position by moving the gas nozzle toward the peripheral edge of the upper surface of the substrate.

According to this method, the gas is discharged from the gas nozzle along an inclined direction that is inclined with respect to the vertical direction so as to approach the peripheral edge of the upper surface of the substrate as the inclined direction goes downward. Therefore, the low surface tension liquid that has splashed when the low surface tension liquid lands on the liquid film is pushed back by the gas before the low surface tension liquid adheres further onto the inner side of the upper surface of the substrate than the opening, and thus lands again on the liquid film. Therefore, the liquid film on the substrate can be satisfactorily removed.

In a preferred embodiment of the present invention, the substrate processing method further includes a substrate heating step of heating the substrate, and the substrate heating step is carried out in parallel with the opening widening step. Lowering of the temperature of the liquid film can thereby be suppressed. Alternatively, the temperature of the liquid film can be increased. The drying speed of the upper surface of the substrate is therefore increased. Therefore, the liquid film on the substrate can be satisfactorily removed.

In a preferred embodiment of the present invention, the liquid landing position moving step includes a low surface tension liquid inclined discharge step of discharging the low surface tension liquid from a low surface tension liquid nozzle along an inclined direction that is inclined with respect to the vertical direction so as to approach the peripheral edge of the upper surface of the substrate as the inclined direction goes downward, and a low surface tension liquid nozzle moving step of moving the liquid landing position by moving the low surface tension liquid nozzle toward the peripheral edge of the substrate.

According to this method, the low surface tension liquid is discharged from the low surface tension liquid nozzle along an inclined direction that is inclined with respect to the vertical direction so as to approach the peripheral edge of the upper surface of the substrate as the inclined direction goes downward. Therefore, the direction in which the low surface tension liquid splashes when the low surface tension liquid lands on the liquid film can be directed toward the peripheral edge side of the substrate. Thus, adhesion of low surface tension liquid that has splashed from the liquid film, onto the portion further toward the inner side of the upper surface of the substrate than the opening, can be suppressed.

In a preferred embodiment of the present invention, the liquid landing position moving step includes a movement decelerating step of decelerating movement of the liquid landing position such that a movement speed of the liquid landing position when the peripheral edge of the opening is positioned in the peripheral edge region of the upper surface of the substrate is lower than the movement speed of the liquid landing position when the peripheral edge of the opening is positioned in the center region of the upper surface of the substrate.

According to this method, it is possible to increase the total amount of the low surface tension liquid supplied to the liquid film when the peripheral edge of the opening is positioned in the peripheral edge region of the upper surface of the substrate. Thus, even when heat amount of the liquid film on the substrate has been drawn out by the substrate, the heat amount can be supplemented by low surface tension liquid freshly supplied to the liquid film. Thereby, the reduction in temperature of the liquid film that is caused when the peripheral edge of the opening approaches the peripheral edge of the upper surface of the substrate can be suppressed. Therefore, the liquid film on the substrate can be satisfactorily removed.

A preferred embodiment of the present invention provides a substrate processing apparatus including a substrate holding unit that holds a substrate horizontally, a processing liquid supply unit that supplies a water-containing processing liquid to an upper surface of the substrate, a low surface tension liquid supply unit that supplies a low surface tension liquid having a lower surface tension than water to the upper surface of the substrate, a gas supply unit that supplies gas to the upper surface of the substrate, a substrate rotating unit that rotates the substrate around a predetermined rotational axis along a vertical direction, a gas supply position moving unit that moves the gas supply position, which is the position on the upper surface of the substrate where the gas is supplied from the gas supply unit, a liquid landing position moving unit that moves the liquid landing position, which is the position on the upper surface of the substrate where the low surface tension liquid lands from the low surface tension liquid supply unit, and a controller that controls the substrate holding unit, the processing liquid supply unit, the low surface tension liquid supply unit, the gas supply unit, the substrate rotating unit, the gas supply position moving unit and the liquid landing position moving unit.

Moreover, the controller is programmed to execute a substrate holding step of holding the substrate horizontally by the substrate holding unit, a processing liquid supply step of supplying the processing liquid from the processing liquid supply unit toward the upper surface of the substrate, a liquid film forming step of forming a liquid film of the low surface tension liquid that covers the upper surface, by supplying the low surface tension liquid from the low surface tension liquid supply unit toward the upper surface of the substrate to replace the processing liquid with the low surface tension liquid, an opening forming step of supplying the gas from the gas supply unit to a center region of the liquid film to form an opening in the center region of the liquid film, an opening widening step of widening the opening in order to remove the liquid film, a substrate rotating step of rotating, in the opening widening step, the substrate by the substrate rotating unit, a gas supply position moving step of blowing, in the opening widening step, the gas from the gas supply unit toward the gas supply position that is set further inward than the peripheral edge of the opening on the upper surface of the substrate, and moving the gas supply position toward the peripheral edge of the upper surface of the substrate by the gas supply position moving unit, and a liquid landing position moving step of supplying, in the opening widening step, the low surface tension liquid from the low surface tension liquid supply unit toward the liquid landing position that is set so as to be positioned on the outer side of the peripheral edge of the opening on the upper surface of the substrate, and moving the liquid landing position toward the peripheral edge of the upper surface of the substrate by the liquid landing position moving unit.

According to this configuration, the substrate rotating step, the gas supply position moving step, and the liquid landing position moving step are carried out when the opening formed in the liquid film of the low surface tension liquid is widened to remove the liquid film from the substrate.

Due to rotation of the substrate during widening of the opening, centrifugal force acts on the liquid film, and the liquid film is extruded out of the substrate. In the gas position moving step, the gas supply position that is set further inward than the peripheral edge of the opening moves toward the peripheral edge of the upper surface of the substrate. Therefore, the blowing force of the gas acts on the inner peripheral edge of the liquid film during widening of the opening. When the blowing force of the gas acts on the inner peripheral edge of the liquid film, the liquid film is more reliably extruded out of the substrate. Consequently, residue of droplets of the low surface tension liquid in the region further inward than the peripheral edge of the opening is suppressed. That is, the region further inward than the peripheral edge of the opening can be satisfactorily dried.

On the other hand, the centrifugal force and blowing force may increase the low surface tension liquid that is discharged out of the substrate, and the centrifugal force and blowing force may reduce the thickness of the liquid film near the opening. In the liquid landing position moving step, the liquid landing position that is set further outward than the peripheral edge of the opening moves toward the peripheral edge of the upper surface of the substrate. The thickness of the liquid film can therefore be adequately ensured. Consequently, thinning of the liquid film near the opening by centrifugal force and blowing force is suppressed. Consequently, the opening can be widened at a uniform speed across the entire region in the direction of rotation.

As described above, the region further inward than the peripheral edge of the opening can be satisfactorily dried while widening the opening at a uniform speed across the entire region in the direction of rotation. As a result, the low surface tension liquid on the substrate can be satisfactorily removed.

In a preferred embodiment of the present invention, the controller is programmed to execute a step of moving, in the liquid landing position moving step, the liquid landing position while forming a liquid buildup at the inner peripheral edge of the liquid film by supply of the low surface tension liquid from the low surface tension liquid supply unit.

According to this configuration, the liquid landing position is moved in a state where the liquid buildup is formed at the inner peripheral edge of the liquid film by supply of the low surface tension liquid. The thickness of the liquid film can therefore be more adequately ensured near the peripheral edge of the opening.

In a preferred embodiment of the present invention, the controller is programmed to execute a low surface tension liquid supply step of supplying the low surface tension liquid from the low surface tension liquid supply unit to the liquid film, in parallel with the opening forming step. The thickness of the liquid film can therefore be adequately ensured near the peripheral edge of the opening when forming the opening. Thus, even if the low surface tension liquid near the peripheral edge of the opening has been pushed away due to supply of the gas during formation of the opening, the thickness of the liquid film near the peripheral edge of the opening is adequately maintained.

In a preferred embodiment of the present invention, the controller is programmed to execute a gas supply continuing step of continuing supply of the gas from the gas supply unit while the opening widening step is carried out. Thus, blowing force can be made to continuously act on the liquid film during widening of the opening. Therefore, the region further inward than the peripheral edge of the opening can be even more satisfactorily dried.

In a preferred embodiment of the present invention, the controller is programmed to execute a rotation deceleration step of decelerating, in the substrate rotating step, rotation of the substrate by the substrate rotating unit such that a rotational speed of the substrate when a peripheral edge of the opening is positioned in the peripheral edge region of the upper surface of the substrate is lower than the rotational speed of the substrate when the peripheral edge of the opening is positioned in the center region of the upper surface of the substrate.

According to this configuration, the liquid film can be increased in thickness when the peripheral edge of the opening has approached the peripheral edge of the upper surface of the substrate. Therefore, the decrease in the low surface tension liquid present on the substrate, that is caused when the peripheral edge of the opening approaches the peripheral edge of the upper surface of the substrate, can be suppressed. Thereby, the reduction in temperature of the liquid film, that is caused when the peripheral edge of the opening approaches the peripheral edge of the upper surface of the substrate, can be suppressed. Consequently, the peripheral edge region of the upper surface of the substrate can be satisfactorily dried.

In a preferred embodiment of the present invention, the controller is programmed to execute a step of decelerating, in the rotation deceleration step, rotation of the substrate by the substrate rotating unit such that the rotational speed of the substrate decreases as the peripheral edge of the opening moves toward the peripheral edge of the upper surface of the substrate.

According to this configuration, the liquid film can be gradually increased in thickness as the peripheral edge of the opening approaches the peripheral edge of the upper surface of the substrate. Thus, the decrease in the low surface tension liquid present on the substrate, that is caused when the peripheral edge of the opening approaches the peripheral edge of the upper surface of the substrate, can be suppressed, even when the peripheral edge of the opening is positioned in the region between the center region and the peripheral edge region. Consequently, change in the temperature of the liquid film can be suppressed, even when the position of the peripheral edge of the opening is at any position of the upper surface of the substrate. As a result, the opening can be satisfactorily widened over the entire region of the upper surface of the substrate. Therefore, the liquid film on the substrate can be satisfactorily removed.

In a preferred embodiment of the present invention, the gas supply unit includes a gas nozzle that discharges the gas in an inclined direction that is inclined with respect to the vertical direction so as to approach the peripheral edge of the upper surface of the substrate as the inclined direction goes downward. In addition, the gas supply position moving unit includes a gas nozzle moving unit that moves the gas nozzle along the upper surface of the substrate. In addition, the controller is programmed to execute a gas inclined discharge step of discharging, in the gas supply position moving step, the gas from the gas nozzle, and a gas nozzle moving step of moving, in the gas supply position moving step, the gas nozzle toward the peripheral edge of the upper surface of the substrate by the gas nozzle moving unit.

According to this configuration, the gas is discharged from the gas nozzle along an inclined direction that is inclined with respect to the vertical direction so as to approach the peripheral edge of the upper surface of the substrate as the inclined direction goes downward. Therefore, the low surface tension liquid that has splashed when the low surface tension liquid lands on the liquid film is pushed back by the gas further outward than the opening, before the low surface tension liquid adheres further onto the inner side of the upper surface of the substrate than the opening. Therefore, the liquid film on the substrate can be satisfactorily removed.

In a preferred embodiment of the present invention, the substrate processing apparatus further includes a substrate heating unit that heats the substrate. In addition, the controller is programmed to execute a substrate heating step of heating the substrate by the substrate heating unit, in parallel with the opening widening step. Lowering of the temperature of the liquid film can thereby be suppressed. Alternatively, the temperature of the liquid film can be increased. The drying speed of the upper surface of the substrate is therefore increased. Therefore, the liquid film on the substrate can be satisfactorily removed.

In a preferred embodiment of the present invention, the low surface tension liquid supply unit includes a low surface tension liquid nozzle that discharges the low surface tension liquid in an inclined direction that is inclined with respect to the vertical direction so as to approach the peripheral edge of the upper surface of the substrate as the inclined direction goes downward. Moreover, the liquid landing position moving unit includes a low surface tension liquid nozzle moving unit that moves the low surface tension liquid nozzle along the upper surface of the substrate. In addition, the controller is programmed to execute, in the liquid landing position moving step, a low surface tension liquid inclined discharge step of discharging the low surface tension liquid from the low surface tension liquid nozzle, and a low surface tension liquid nozzle moving step of moving the low surface tension liquid nozzle toward the peripheral edge of the upper surface of the substrate by the low surface tension liquid nozzle moving unit.

According to this configuration, the low surface tension liquid is discharged from the low surface tension liquid nozzle along an inclined direction that is inclined with respect to the vertical direction so as to approach the peripheral edge of the upper surface of the substrate as the inclined direction goes downward. Therefore, the direction in which the low surface tension liquid splashes when the low surface tension liquid lands on the liquid film can be directed toward the peripheral edge side of the substrate. Thus, adhesion of low surface tension liquid that has splashed from the liquid film, onto the portion further toward the inner side of the upper surface of the substrate than the opening, can be suppressed.

According to a preferred embodiment of the present invention, the controller is programmed to execute a movement decelerating step of decelerating, in the liquid landing position moving step, movement of the liquid landing position by the liquid landing position moving unit, such that a movement speed of the liquid landing position when the peripheral edge of the opening is positioned in the peripheral edge region of the upper surface of the substrate is lower than the movement speed of the liquid landing position when the peripheral edge of the opening is positioned in the center region of the upper surface of the substrate.

According to this configuration, it is possible to increase the total amount of the low surface tension liquid supplied to the liquid film when the peripheral edge of the opening is positioned in the peripheral edge region of the upper surface of the substrate. Thus, even when heat amount of the liquid film on the substrate has been drawn out by the substrate, the heat amount can be supplemented by low surface tension liquid freshly supplied to the liquid film. Thereby, the reduction in temperature of the liquid film that is caused when the peripheral edge of the opening approaches the peripheral edge of the upper surface of the substrate can be suppressed. Therefore, the liquid film on the substrate can be satisfactorily removed.

The aforementioned and yet other objects, features, and effects of the present invention will be made clear by the following description of the preferred embodiments with reference to the attached drawings.

DETAILED DESCRIPTION OF THE PREFERRED EMBODIMENTS

First Preferred Embodiment

Figure 1:
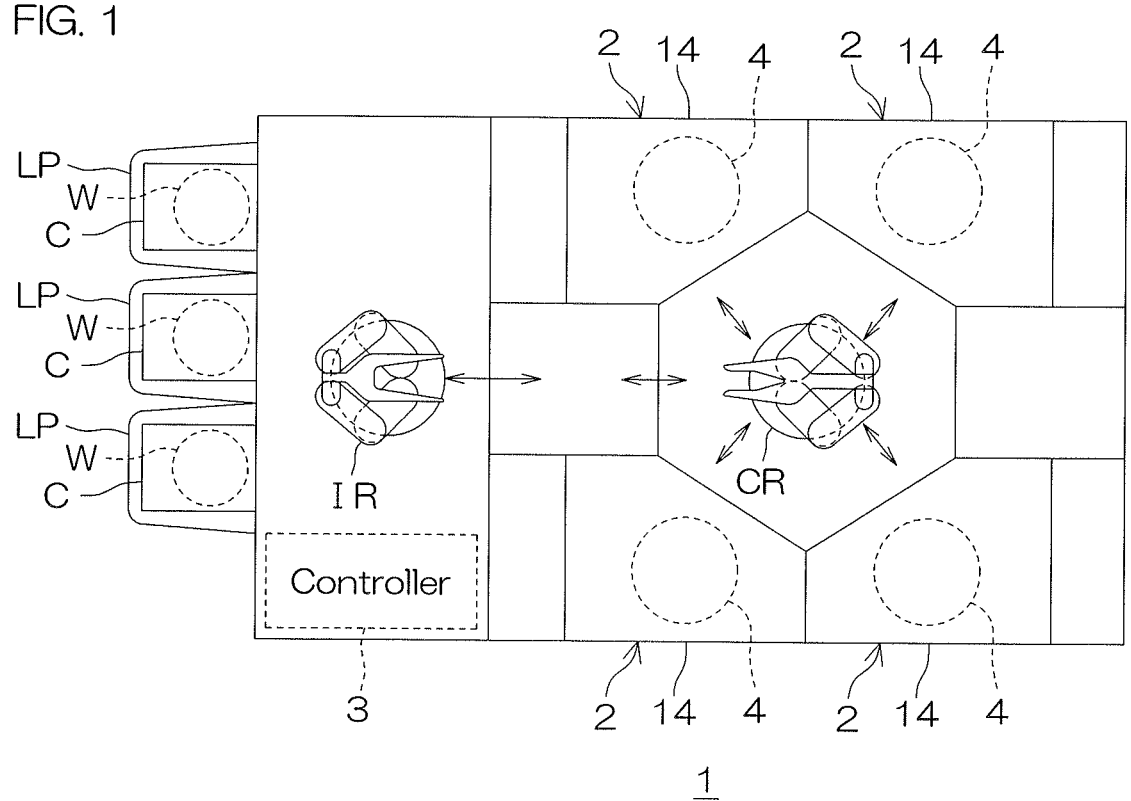
FIG. 1 is a plan view for describing a configuration of a substrate processing apparatus according to a first preferred embodiment of the present invention.

FIG. 1 is an illustrative plan view for describing a layout of the interior of a substrate processing apparatus 1 according to a first preferred embodiment of the present invention.

The substrate processing apparatus 1 is a single substrate processing type apparatus that processes substrates W such as silicon wafers, one by one. In this preferred embodiment, each substrate W is a disk-shaped substrate. The substrate processing apparatus 1 includes a plurality of processing units 2 that process substrates W with a processing liquid, load ports LP in each of which is placed a carrier C that houses a plurality of substrates W to be processed by the processing units 2, transfer robots IR and CR that transport the substrates W between the load ports LP and the processing units 2, and a controller 3 that controls the substrate processing apparatus 1. The chemical liquid, rinse liquid and organic solvent described below are included in the processing liquid. The transfer robot IR conveys the substrates W between the carriers C and the substrate transfer robot CR. The transfer robot CR conveys the substrates W between the transfer robot IR and the processing units 2. The plurality of processing units 2 may have the same configuration, for example.

Figure 2:
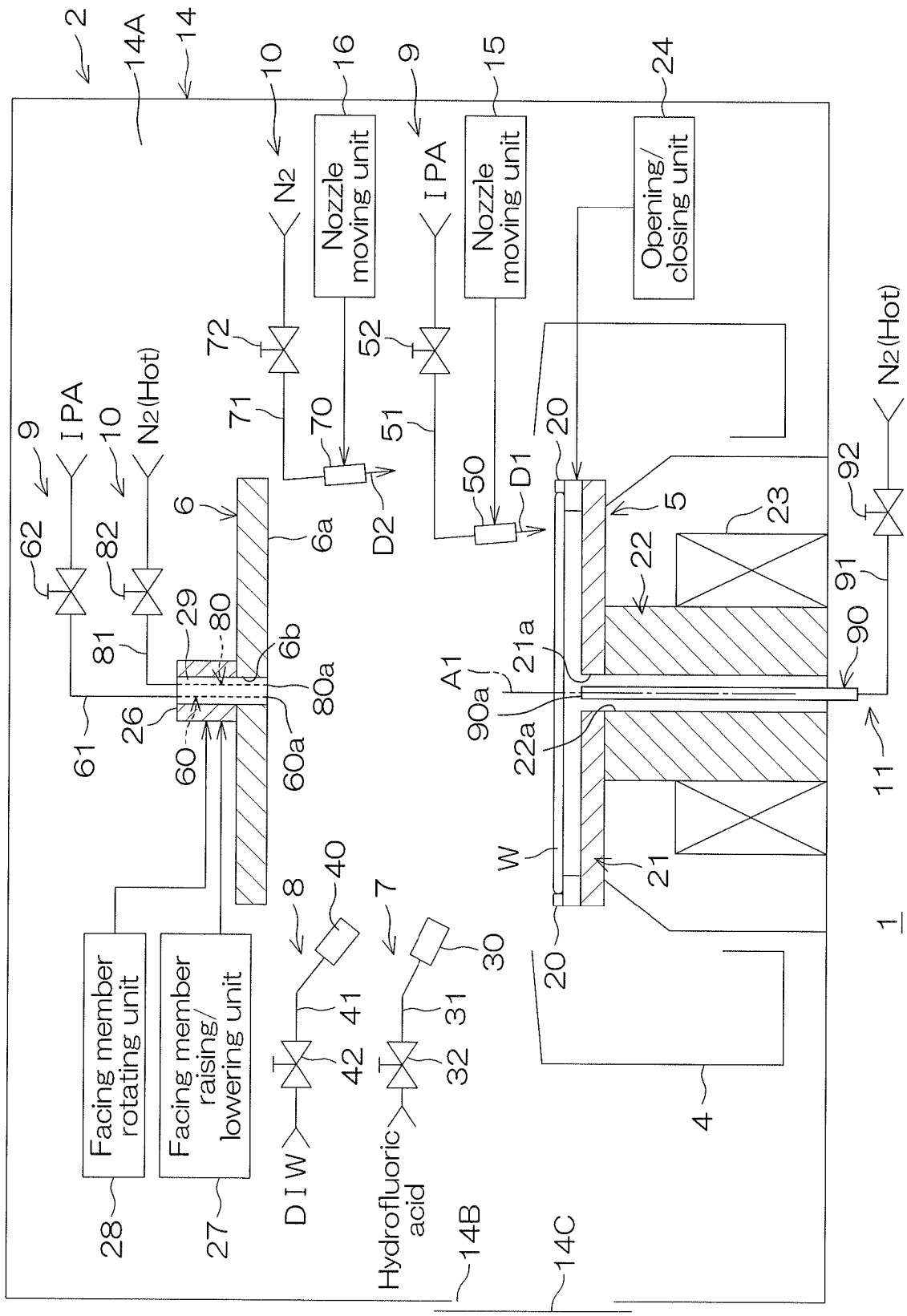
FIG. 2 is an illustrative cross-sectional view for describing a configuration example of a processing unit included in the substrate processing apparatus.

FIG. 2 is a schematic diagram for describing a configuration example of a processing unit 2.

The processing unit 2 includes a cup 4, a spin chuck 5, a facing member 6, a chemical liquid supply unit 7, a rinse liquid supply unit 8, an organic solvent supply unit 9, a gas supply unit 10 and a heating fluid supply unit 11.

The spin chuck 5 rotates a single substrate W around a vertical rotational axis A1 which passes through the central portion of the substrate W, while holding the substrate W in a horizontal orientation. Each of the cups 4 has a cylindrical form and the cups 4 surround the spin chuck 5. The cup 4 also has an annular groove that opens upward. A recovery piping (not shown) or a discharge piping (not shown) is connected to the groove of the cup 4. The cup 4 receives processing liquid that has splashed from the substrate W. Processing liquid received by the cup 4 runs through the recovery piping or the discharge piping and is recovered or discarded.

The processing unit 2 further includes a chamber 14 that houses the cup 4. In the chamber 14, an entrance/exit 14B for carrying of the substrate W into an interior space 14A of the chamber 14 and carrying of the substrate W out from the chamber 14 is formed. The chamber 14 includes a shutter unit 14C that opens and closes the entrance/exit 14B.

The spin chuck 5 includes chuck pins 20, a spin base 21, a rotating shaft 22, and an electric motor 23 that applies rotary force to the rotating shaft 22. The spin base 21 has a disk shape along the horizontal direction. The plurality of chuck pins 20 are disposed at intervals in the circumferential direction on the upper surface of the spin base 21. The plurality of chuck pins 20 are opened and closed by an opening/closing unit 24. The plurality of chuck pins 20 hold (clamp) the substrate W horizontally by setting the chuck pins 20 to the closed state by the opening/closing unit 24. The plurality of chuck pins 20 release the substrate W by setting the chuck pins 20 to the open state by the opening/closing unit 24. The plurality of chuck pins 20 and spin base 21 are included in the substrate holding unit that holds the substrate W horizontally. The substrate holding unit is also referred to as a substrate holder.

The rotating shaft 22 extends in the vertical direction along the rotational axis A1. The upper end portion of the rotating shaft 22 is coupled to the center of the lower surface of the spin base 21. In the center region of the spin base 21, in plan view, a penetrating hole 21a which vertically penetrates through the spin base 21 is formed. The penetrating hole 21a communicates with an interior space 22a of the rotating shaft 22. The electric motor 23 applies rotary force to the rotating shaft 22. Due to rotation of the rotating shaft 22 by the electric motor 23, the spin base 21 rotates. The substrate W is thereby rotated around the rotational axis A1. The inner side in the rotational radius direction of the substrate W shall hereunder be referred to simply as "radially inner side," and the outer side in the rotational radius direction of the substrate W shall hereunder be referred to simply as "radially outer side." The electric motor 23 is included in a substrate rotating unit that rotates the substrate W around the rotational axis A1.

The facing member 6 is formed as a disk shape having a diameter approximately equal to the substrate W or larger than the substrate W, and it is disposed approximately horizontally above the spin chuck 5. The facing member 6 has a facing surface 6a that faces the upper surface of the substrate W. A hollow shaft 26 is fixed on the side of the facing member 6 opposite the facing surface 6a. In the portion of the facing member 6 including the position overlapping with the rotational axis A1 in plan view, a communicating hole 6b that runs vertically through the facing member 6 and communicates with the interior space of the hollow shaft 26 is formed.

The processing unit 2 also includes a facing member raising/lowering unit 27 that drives raising and lowering of the facing member 6, and a facing member rotating unit 28 that rotates the facing member 6 around the rotational axis A1.

The facing member raising/lowering unit 27 can position the facing member 6 at any desired position (height) from a lower position to an upper position. The lower position is the position within the movable range of the facing member 6, at which the facing surface 6a of the facing member 6 is most proximal to the substrate W. The upper position is the position within the movable range of the facing member 6, at which the facing surface 6a of the facing member 6 is most distant from the substrate W. The facing member raising/lowering unit 27 includes, for example, a ball screw mechanism (not shown), and an electric motor (not shown) that applies driving force to the ball screw mechanism.

The facing member rotating unit 28 rotates the facing member 6 by rotating the hollow shaft 26. The facing member rotating unit 28 includes an electric motor (not shown) that transmits driving force to the hollow shaft 26.

The chemical liquid supply unit 7 is a unit that supplies a chemical liquid to the center region of the upper surface of the substrate W. The center region of the upper surface of the substrate W is the region around the center of the upper surface of the substrate W, including an intersection position of the upper surface of the substrate W and the rotational axis A1. The region around the peripheral edge of the upper surface of the substrate W including the peripheral edge of the upper surface of the substrate W is referred to as the peripheral edge region. The chemical liquid supply unit 7 includes a chemical liquid nozzle 30 that discharges the chemical liquid toward the center region of the upper surface of the substrate W, a chemical liquid supply pipe 31 coupled to the chemical liquid nozzle 30, and a chemical liquid valve 32 interposed in the chemical liquid supply pipe 31. The chemical liquid such as hydrofluoric acid (hydrogen fluoride solution: HF) is supplied to the chemical liquid supply pipe 31 from a chemical liquid supply source. The chemical liquid valve 32 opens and closes a flow passage in the chemical liquid supply pipe 31. The chemical liquid nozzle 30 is a fixed nozzle having a fixed position in the horizontal direction and vertical direction.

The chemical liquid discharged from the chemical liquid nozzle 30 is not limited to hydrofluoric acid. The chemical liquid discharged from the chemical liquid nozzle 30 may be a liquid including at least one from among sulfuric acid, acetic acid, nitric acid, hydrochloric acid, hydrofluoric acid, buffered hydrofluoric acid (BHF), dilute hydrofluoric acid (DHF), ammonia water, hydrogen peroxide water, and organic acid (such as citric acid or oxalic acid), an organic alkali (such as TMAH: tetramethylammonium hydroxide), surfactants and corrosion inhibitors. Examples of chemical liquids that are mixtures of these include SPM (sulfuric acid/hydrogen peroxide water mixture), SC1 (ammonia/hydrogen peroxide water mixture), and SC2 (hydrochloric acid/hydrogen peroxide water mixture).

The rinse liquid supply unit 8 is a unit that supplies a rinse liquid to the center region of the upper surface of the substrate W. The rinse liquid supply unit 8 includes a rinse liquid nozzle 40 that discharges the rinse liquid toward the center region of the upper surface of the substrate W, a rinse liquid supply pipe 41 coupled to the rinse liquid nozzle 40, and a rinse liquid valve 42 interposed in the rinse liquid supply pipe 41. The rinse liquid such as deionized water (DIW) is supplied to the rinse liquid supply pipe 41 from a rinse liquid supply source. The rinse liquid valve 42 opens and closes a flow passage in the rinse liquid supply pipe 41. The rinse liquid nozzle 40 is a fixed nozzle having a fixed position in the horizontal direction and vertical direction.

The rinse liquid discharged from the rinse liquid nozzle 40 is not limited to DIW. The rinse liquid discharged from the rinse liquid nozzle 40 may be carbonated water, electrolytic ion water, ozone water, ammonia water, aqueous hydrochloric acid solution of dilute concentration (of, for example, approximately 10 ppm to 100 ppm), or reduced water (hydrogen water). The rinse liquid discharged from the rinse liquid nozzle 40 may be high-temperature DIW. High-temperature DIW is DIW at 80° C. to 85° C., for example. The rinse liquid discharged from the rinse liquid nozzle 40 is thus an aqueous solution or water. That is, the rinse liquid discharged from the rinse liquid nozzle 40 contains water. The rinse liquid supply unit 8 including the rinse liquid nozzle 40 is an example of a processing liquid supply unit that supplies water-containing processing liquid to the upper surface of the substrate W.

The organic solvent supply unit 9 is a unit that supplies an organic solvent to the upper surface of the substrate W. The organic solvent supply unit 9 includes a first organic solvent nozzle 50 that discharges the organic solvent toward the upper surface of the substrate W, a first organic solvent supply pipe 51 coupled to the first organic solvent nozzle 50, and a first organic solvent valve 52 interposed in the first organic solvent supply pipe 51. The organic solvent such as IPA is supplied to the first organic solvent supply pipe 51 from a first organic solvent supply source. The first organic solvent valve 52 opens and closes a flow passage in the first organic solvent supply pipe 51.

The first organic solvent nozzle 50 discharges the organic solvent in an inclined direction D1. The inclined direction D1 is a direction that is inclined with respect to the vertical direction so as to approach the peripheral edge of the upper surface of the substrate W as it goes downward. An intersection angle between a straight line extending in the inclined direction D1 and a straight line extending in the vertical direction is 5° to 45°, for example. For convenience of illustration, the intersection angle between the straight line extending in the inclined direction D1 and the straight line extending in the vertical direction is shown as an angle smaller than 45°, but the intersection angle is preferably 45°.

The processing unit 2 further includes an organic solvent nozzle moving unit 15 that moves the first organic solvent nozzle 50 in the horizontal direction and the vertical direction. The first organic solvent nozzle 50 is moved along the upper surface of the substrate W between a center position and a home position (retreat position), by movement in the horizontal direction. When the first organic solvent nozzle 50 is positioned at the center position, the first organic solvent nozzle 50 faces the rotational center of the upper surface of the substrate W. When the first organic solvent nozzle 50 is positioned at the retreat position, the first organic solvent nozzle 50 is positioned outside of the cup 4, in plan view. The rotational center of the upper surface of the substrate W is an intersection position of the upper surface of the substrate W that intersects with the rotational axis A1. By movement in the vertical direction, the first organic solvent nozzle 50 can approach the upper surface of the substrate W or retreat upward from the upper surface of the substrate W.

The organic solvent nozzle moving unit 15 includes, for example, a rotating shaft (not shown) that extends along the vertical direction, an arm (not shown) that is coupled with the rotating shaft and extends horizontally, and an arm driving mechanism (not shown) that drives the arm. The arm driving mechanism swings the arm by rotating the rotating shaft around a vertical rotating axis and raises and lowers the arm by raising and lowering the rotating shaft along the vertical direction. The first organic solvent nozzle 50 is fixed to the arm. The first organic solvent nozzle 50 moves in the horizontal direction and vertical direction in response to swinging and raising/lowering of the arm.

The organic solvent supply unit 9 further includes a second organic solvent nozzle 60 that discharges an organic solvent toward the upper surface of the substrate W, a second organic solvent supply pipe 61 coupled to the second organic solvent nozzle 60, and a second organic solvent valve 62 interposed in the second organic solvent supply pipe 61. An organic solvent such as IPA is supplied to the second organic solvent supply pipe 61 from a second organic solvent supply source. The second organic solvent valve 62 opens and closes a flow passage in the second organic solvent supply pipe 61.

The second organic solvent nozzle 60 is housed in a nozzle housing member 29 that is inserted in the communicating hole 6b of the facing member 6. The lower end portion of the nozzle housing member 29 faces the center region of the upper surface of the substrate W. The second organic solvent nozzle 60 has a discharge port 60a that is exposed from the lower end portion of the nozzle housing member 29.

In this preferred embodiment, the organic solvent supply unit 9 has a configuration that supplies the organic solvent such as IPA. However, it is sufficient if the organic solvent supply unit 9 functions as a low surface tension liquid supply unit that supplies a low surface tension liquid with a lower surface tension than water to the upper surface of the substrate W. The first organic solvent nozzle 50 functions as a low surface tension liquid nozzle that discharges the low surface tension liquid in the inclined direction D1. Also, the organic solvent nozzle moving unit 15 functions as a low surface tension liquid nozzle moving unit that moves the low surface tension liquid nozzle along the upper surface of the substrate W.

Figure 14:
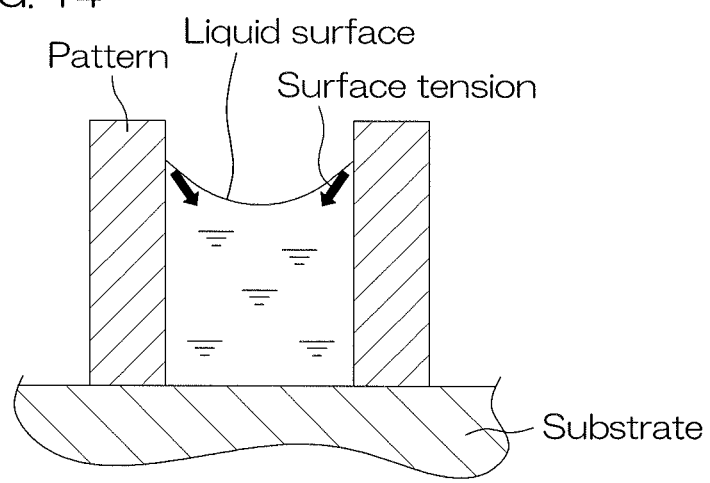
FIG. 14 is an illustrative cross-sectional view for describing principles of pattern collapse due to surface tension.

The low surface tension liquid is not limited to IPA. The low surface tension liquid used may be an organic solvent that does not chemically react (that has low reactivity) with the upper surface of the substrate W and the pattern that is formed on the substrate W (see FIG. 14). The organic solvent discharged from the first organic solvent nozzle 50 and the organic solvent discharged from the second organic solvent nozzle 60 may be an organic solvent that contains at least one from among IPA, HFE (hydrofluoroether), methanol, ethanol, acetone and trans-1,2-dichloroethylene.

The organic solvent discharged from the first organic solvent nozzle 50 and the organic solvent discharged from the second organic solvent nozzle 60 are preferably at their boiling point or a temperature slightly lower than their boiling point. That is, when the organic solvent is IPA, the IPA is preferably at 76° C. to 82.4° C.

The gas supply unit 10 is a unit that supplies a gas to the upper surface of the substrate W. The gas supply unit 10 includes a first gas nozzle 70 that discharges a gas toward the upper surface of the substrate W, a first gas supply pipe 71 coupled to the first gas nozzle 70, and a first gas valve 72 interposed in the first gas supply pipe 71. The gas such as nitrogen gas ($N_2$) is supplied to the first gas supply pipe 71 from a first gas supply source. The first gas valve 72 opens and closes a flow passage in the first gas supply pipe 71.

The first gas nozzle 70 discharges gas in an inclined direction D2. The inclined direction D2 is a direction that is inclined with respect to the vertical direction so as to approach the peripheral edge of the upper surface of the substrate W as it goes downward. An intersection angle between a straight line extending in the inclined direction D2 and a straight line extending in the vertical direction is 5° to 45°, for example. For convenience of illustration, the intersection angle between the straight line extending in the inclined direction D2 and the straight line extending in the vertical direction is shown as an angle smaller than 45°, but the intersection angle is preferably 45°.

The processing unit 2 further includes a gas nozzle moving unit 16 that moves the first gas nozzle 70 in the horizontal direction and the vertical direction. The gas nozzle moving unit 16 moves the first gas nozzle 70 along the upper surface of the substrate W, between a center position and a home position (retreat position). When the first gas nozzle 70 is positioned at the center position, the first gas nozzle 70 faces the rotational center of the upper surface of the substrate W. The retreat position is the position further on the radially outer side than the cup 4. By movement in the vertical direction, the first gas nozzle 70 can approach the upper surface of the substrate W or retreat upward from the upper surface of the substrate W.

The gas nozzle moving unit 16 includes, for example, a rotating shaft (not shown) that extends along the vertical direction, an arm (not shown) that is coupled with the rotating shaft and extends horizontally, and an arm driving mechanism (not shown) that drives the arm. The arm driving mechanism swings the arm by rotating the rotating shaft around a vertical rotating axis and raises and lowers the arm by raising and lowering the rotating shaft along the vertical direction. The first gas nozzle 70 is fixed to the arm. The first gas nozzle 70 moves in the horizontal direction and vertical direction in response to swinging and raising/lowering of the arm.

The gas supply unit 10 further includes a second gas nozzle 80 that discharges a gas toward the upper surface of the substrate W, a second gas supply pipe 81 coupled to the second gas nozzle 80, and a second gas valve 82 interposed in the second gas supply pipe 81. A gas such as high-temperature nitrogen gas ($N_2$ (hot)) is supplied to the second gas supply pipe 81 from a second gas supply source. The second gas valve 82 opens and closes a flow passage in the second gas supply pipe 81. The high-temperature nitrogen gas is nitrogen gas heated to about 75° C.

The second gas nozzle 80 is housed in the nozzle housing member 29 together with the second organic solvent nozzle 60. The tip of the second gas nozzle 80 is exposed from the lower end portion of the nozzle housing member 29.

The gas discharged from the first gas nozzle 70 and the gas discharged from the second gas nozzle 80 are not limited to nitrogen gas. The gas discharged from the first gas nozzle 70 and the gas discharged from the second gas nozzle 80 are preferably inert gases. The inert gas may be any gas that is inert to the upper surface of the substrate W and the pattern, and the inert gas may be a rare gas such as argon, for example. The gas discharged from the first gas nozzle 70 may be air.

The heating fluid supply unit 11 is a unit that supplies a heating fluid to the center region of the lower surface of the substrate W. The center region of the lower surface of the substrate W is the region around the center of the lower surface of the substrate W, including an intersection position of the lower surface of the substrate W and the rotational axis A1. The heating fluid supply unit 11 includes a heating fluid nozzle 90 that discharges a heating fluid toward the center region of the lower surface of the substrate W, a heating fluid supply pipe 91 coupled to the heating fluid nozzle 90, and a heating fluid valve 92 interposed in the heating fluid supply pipe 91. The heating fluid such as high-temperature nitrogen gas ($N_2$ (hot)) is supplied to the heating fluid supply pipe 91 from a heating fluid supply source. The heating fluid valve 92 opens and closes a flow passage in the heating fluid supply pipe 91. The heating fluid nozzle 90 is inserted in the rotating shaft 22. The heating fluid nozzle 90 has a discharge port 90a that is exposed from the upper surface of the spin base 21.

The heating fluid discharged from the heating fluid nozzle 90 is not limited to high-temperature nitrogen. The heating fluid discharged from the heating fluid nozzle 90 may be any fluid which can heat the substrate W. The heating fluid discharged from the heating fluid nozzle 90 may be hot water, for example. The hot water is water at a higher temperature than room temperature, such as water of 80° C. to 85° C. The heating fluid discharged from the heating fluid nozzle 90 may be steam. If the heating fluid is steam, the substrate W can be heated by a fluid at higher temperature than hot water.

Figure 3:
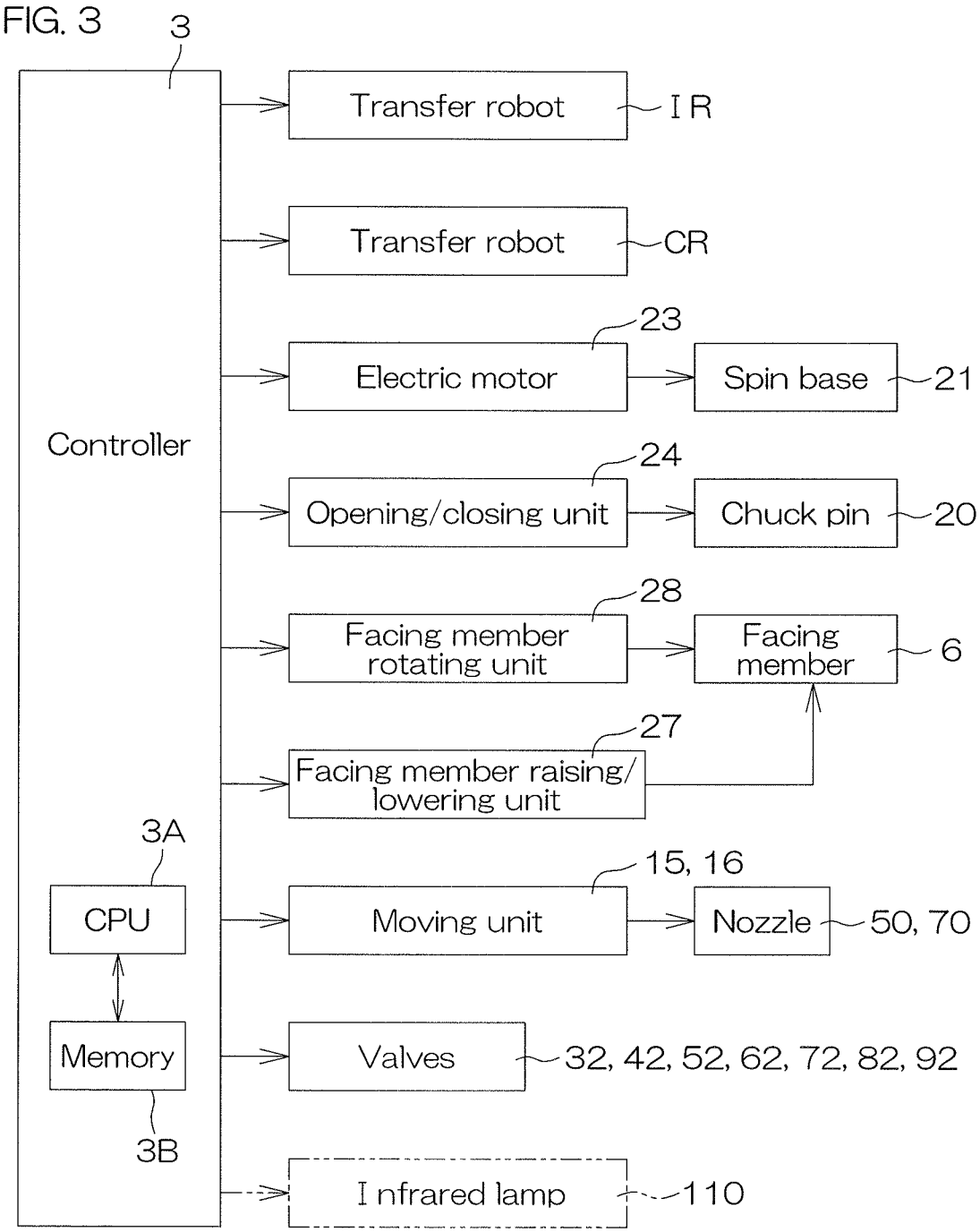
FIG. 3 is a block diagram for describing an electrical configuration of a main portion of the substrate processing apparatus.

FIG. 3 is a block diagram for describing an electrical configuration of a main portion of a substrate processing apparatus 1. The controller 3 has a microcomputer, and the controller 3 controls objects to be controlled, that are components of the substrate processing apparatus 1, according to a predetermined program. More specifically, the controller 3 includes a processor (CPU) 3A and a memory 3B in which a program has been stored, and the processor 3A executes the program to thereby execute various controls for the substrate processing. In particular, the controller 3 controls operations of the transfer robots IR, CR, the electric motor 23, the opening/closing unit 24, the facing member raising/lowering unit 27, the facing member rotating unit 28 and the valves 32, 42, 52, 62, 72, 82, 92, and the like.

Figure 4:
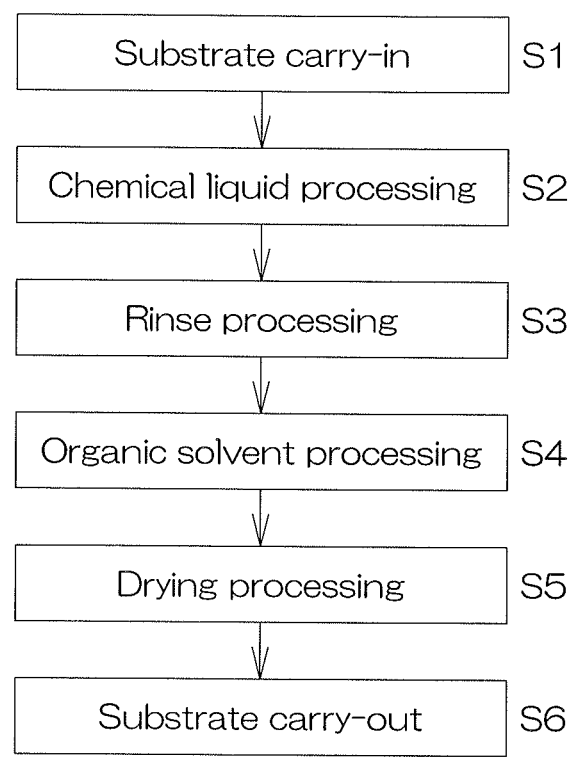
FIG. 4 is a flow diagram for describing an example of substrate processing by the substrate processing apparatus.

FIG. 4 is a flow diagram for describing an example of substrate processing by the substrate processing apparatus 1, mainly showing the processing realized by the controller 3 executing a program. FIGS. 5A to 5E are illustrative cross-sectional views for describing an example of substrate processing.

In substrate processing by the substrate processing apparatus 1, carry-in of a substrate (S1), chemical liquid processing (S2), rinse processing (S3), organic solvent processing (S4), drying processing (S5), and carry-out of the substrate (S6) are carried out in that order as shown in FIG. 4, for example.

First, in the substrate processing by the substrate processing apparatus 1, with reference to FIG. 1, a substrate W is carried from the carrier C into a processing unit 2 and transferred to the spin chuck 5, by the transfer robots IR and CR (step S1: substrate carry-in).

Referring to FIG. 2, the opening/closing unit 24 then brings the chuck pins 20 into the closed state. The substrate W is subsequently held horizontal by the chuck pins 20 at a distance above the upper surface of the spin base 21 until the substrate W is carried out by the transfer robot CR (substrate holding step). The electric motor 23 then starts rotation of the spin base 21. Rotation of the substrate W is thereby started (substrate rotating step). Then, the facing member raising/lowering unit 27 positions the facing member 6 at the upper position. The facing member rotating unit 28 then rotates the facing member 6 in synchronization with the substrate W. The phrase "rotates in synchronization" means rotation in the same direction at the same rotational speed. The facing member 6 may be constantly rotated in synchronization during rotation of the substrate W. The second gas valve 82 is then opened. This starts replacement of the atmosphere in the chamber 14 by high-temperature nitrogen gas (atmosphere replacement step).

Chemical liquid processing (S2) is then started. In the chemical liquid processing (S2), by supplying hydrofluoric acid (HF) as a chemical liquid onto the substrate W, processing, such as etching, is applied to the upper surface of the substrate W.

Specifically, the chemical liquid valve 32 is opened. The hydrofluoric acid (the chemical liquid) is thereby supplied from the chemical liquid nozzle 30 of the chemical liquid supply unit 7 to the center region of the upper surface of the substrate W that is in a rotation state. The hydrofluoric acid is spread over the entire upper surface of the substrate W by centrifugal force. The hydrofluoric acid splashes to the radially outer side from the substrate W by centrifugal force. In the chemical liquid processing (S2), the electric motor 23 rotates the substrate W at 1500 rpm, for example.

After the chemical liquid processing (S2) for a fixed time period, the rinse processing (S3) is carried out. In the rinse processing, the hydrofluoric acid (the chemical liquid) on the substrate W is replaced with DIW (the rinse liquid), and the upper surface of the substrate W is thereby rinsed.

Figure 5A:
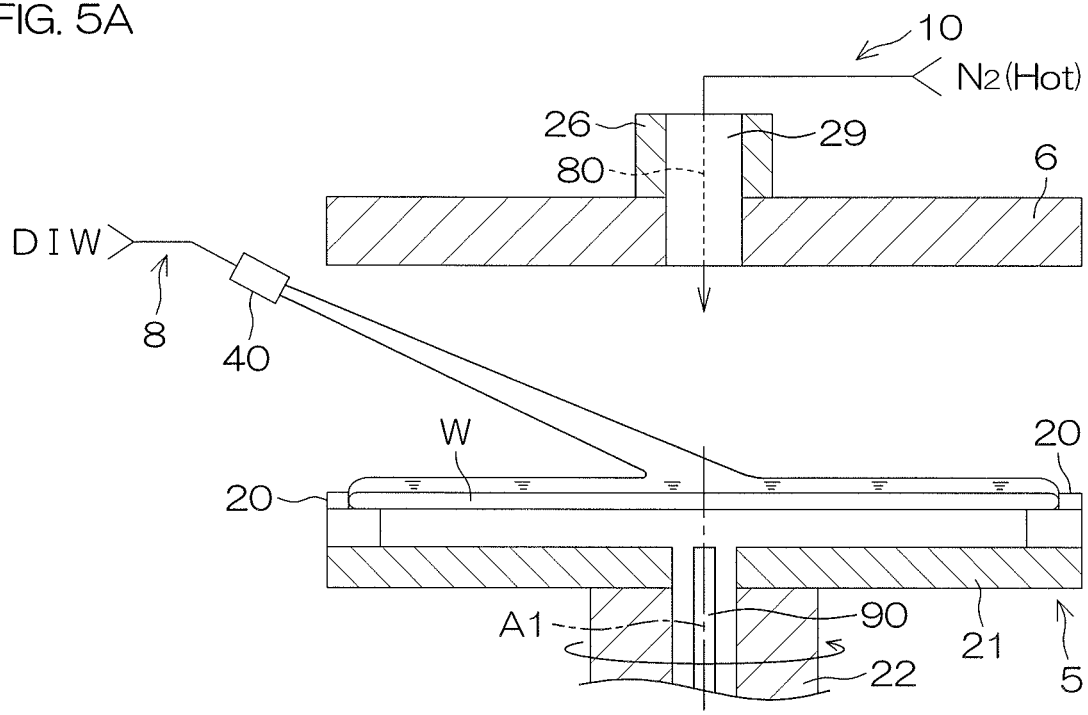
FIGS. 5A to 5E are illustrative cross-sectional views for describing an example of the substrate processing.

Specifically, the chemical liquid valve 32 is closed. Discharge of the hydrofluoric acid from the chemical liquid nozzle 30 is thereby stopped. The rinse liquid valve 42 is then opened. Thereby, as shown in FIG. 5A, DIW is supplied as the rinse liquid (the water-containing processing liquid) from the rinse liquid nozzle 40 of the rinse liquid supply unit 8 toward the center region of the upper surface of the substrate W that is in a rotation state (processing liquid supply step). The DIW spreads over the entire upper surface of the substrate W by centrifugal force. The hydrofluoric acid on the substrate W is thereby replaced by DIW. The hydrofluoric acid and DIW mixture, or the DIW, splashes to the radially outer side from the substrate W by centrifugal force. In the rinse processing (S3), the electric motor 23 rotates the substrate W at 1500 rpm, for example.

After the rinse processing (S3) for a fixed time period, the organic solvent processing (S4) is carried out. In the organic solvent processing (S4), the DIW (rinse liquid) on the substrate W is replaced with IPA (organic solvent).

Figure 5B:
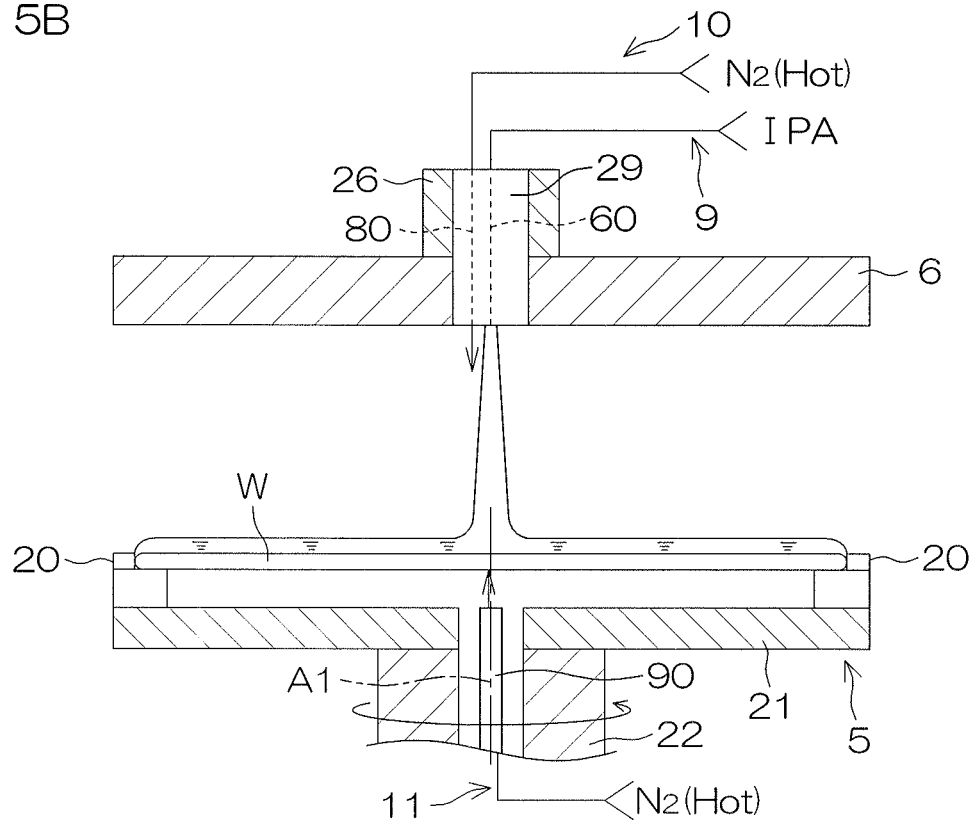

Specifically, the rinse liquid valve 42 is closed. Discharge of the DIW from the rinse liquid nozzle 40 is thereby stopped. Also, the electric motor 23 decelerates rotation of the substrate W such that the rotational speed of the substrate W is reduced (to 10 rpm, for example). The first organic solvent valve 52 is then opened. Thereby, as shown in FIG. 5B, IPA is supplied as the organic solvent (the low surface tension liquid) from the second organic solvent nozzle 60 of the organic solvent supply unit 9 toward the center region of the upper surface of the substrate W that is in a rotation state (low surface tension liquid supply step). The IPA supplied from the second organic solvent nozzle 60 is at 76° C. to 82.4° C. The IPA spreads over the entire upper surface of the substrate W by centrifugal force. The DIW on the substrate W is thereby replaced by IPA. The DIW and IPA mixture, or the IPA, splashes to the radially outer side from the substrate W by centrifugal force.

The heating fluid valve 92 is then opened. High-temperature nitrogen gas ($N_2$ (hot)), as the heating fluid, is thereby discharged from the heating fluid nozzle 90 of the heating fluid supply unit 11 toward the center region of the lower surface of the substrate W. Heating of the substrate W is thereby started (substrate heating step). Thus, the heating fluid supply unit 11 functions as a substrate heating unit that heats the substrate W.

Figure 5C:
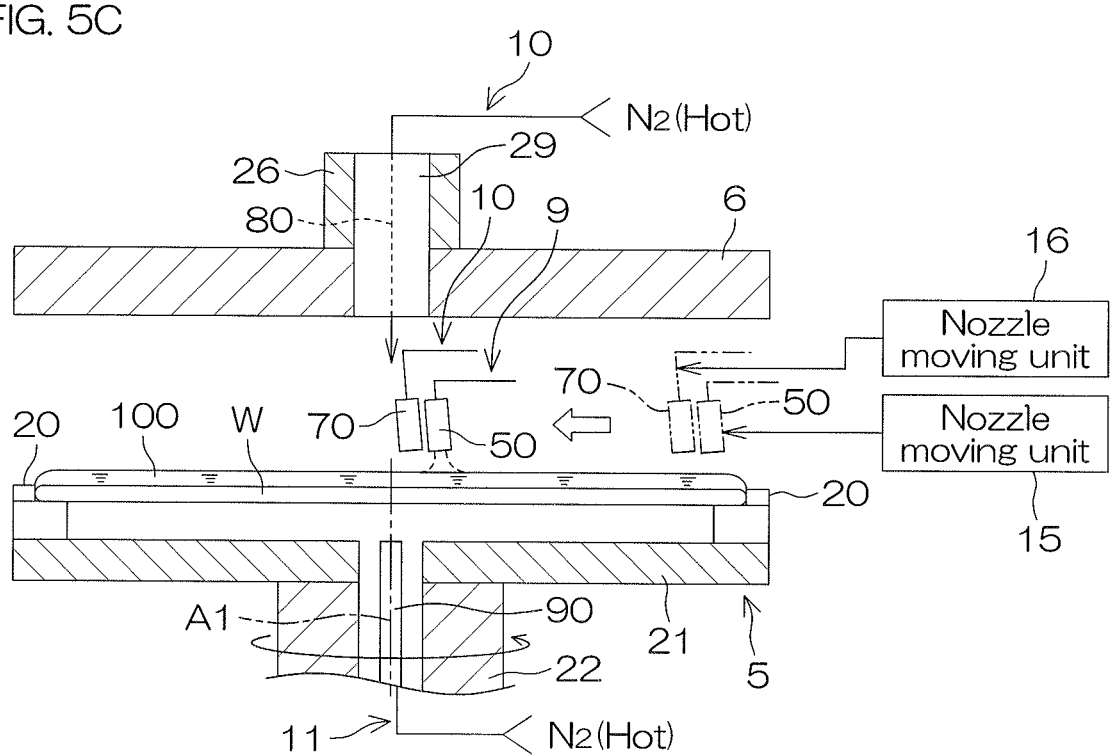

After the rinse liquid on the substrate W has been completely replaced by IPA, the second organic solvent valve 62 is closed. Since the rotational speed of the substrate W is at a low speed, splashing of the IPA by centrifugal force is suppressed. Therefore, as shown in FIG. 5C, a thick liquid film 100 of IPA is formed on the substrate W and held on the substrate W. The liquid film 100 covers the upper surface of the substrate W. The liquid film 100 is thus formed on the substrate W by replacing the DIW on the substrate W with IPA, by supply of IPA to the upper surface of the substrate W (liquid film forming step). Replacement of the atmosphere of the interior space 14A of the chamber 14 by high-temperature nitrogen gas is preferably completed before the liquid film 100 is formed.

As shown in FIG. 5C, in parallel with formation of the liquid film 100, the organic solvent nozzle moving unit moves the first organic solvent nozzle 50 toward a predetermined processing position. The gas nozzle moving unit 16 also moves the first gas nozzle 70 toward a predetermined processing position. The processing position of the first gas nozzle 70 is a position shifted slightly from the center of rotation of the substrate W toward the radially outer side. The processing position of the first organic solvent nozzle 50 is a position slightly further toward the radially outer side than the processing position of the first gas nozzle 70.

The gas nozzle moving unit 16 moves the first gas nozzle 70 such that the first gas nozzle 70 reaches the processing position when the second organic solvent valve 62 is closed. The organic solvent nozzle moving unit 15 moves the first organic solvent nozzle 50 such that the first organic solvent nozzle 50 reaches the processing position when the second organic solvent valve 62 is closed.

After the organic solvent processing (S4) for a predetermined time period, the drying processing (S5) is carried out. In the drying processing (S5), the liquid film 100 of IPA is removed from the substrate W (liquid film removal step), and the substrate W is thereby dried.

Figure 5D:
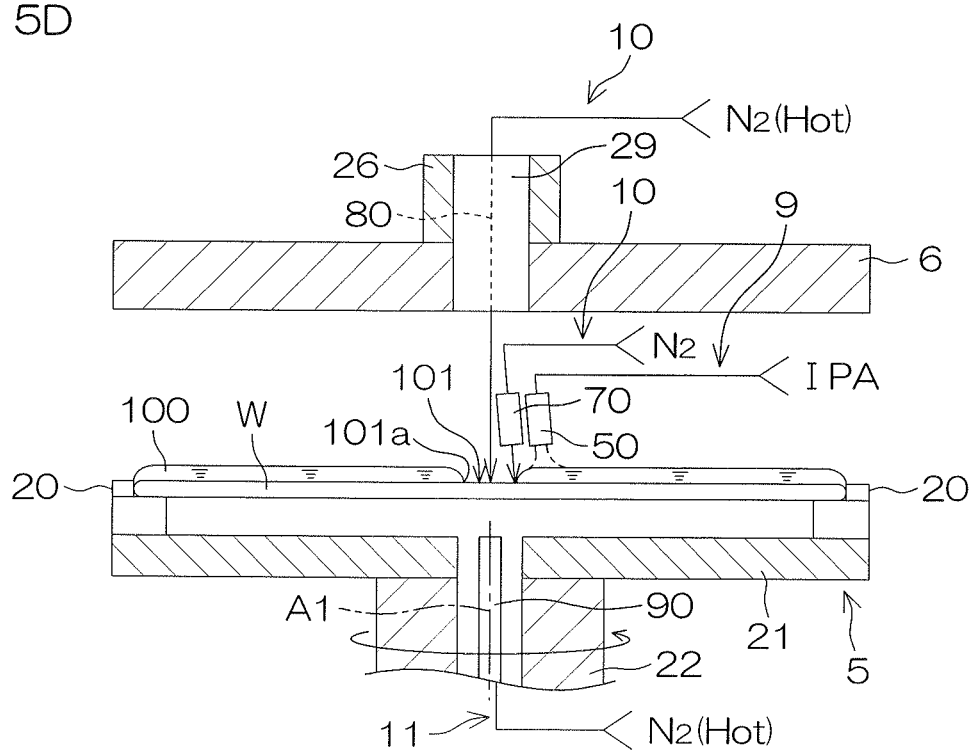
Figure 6A:
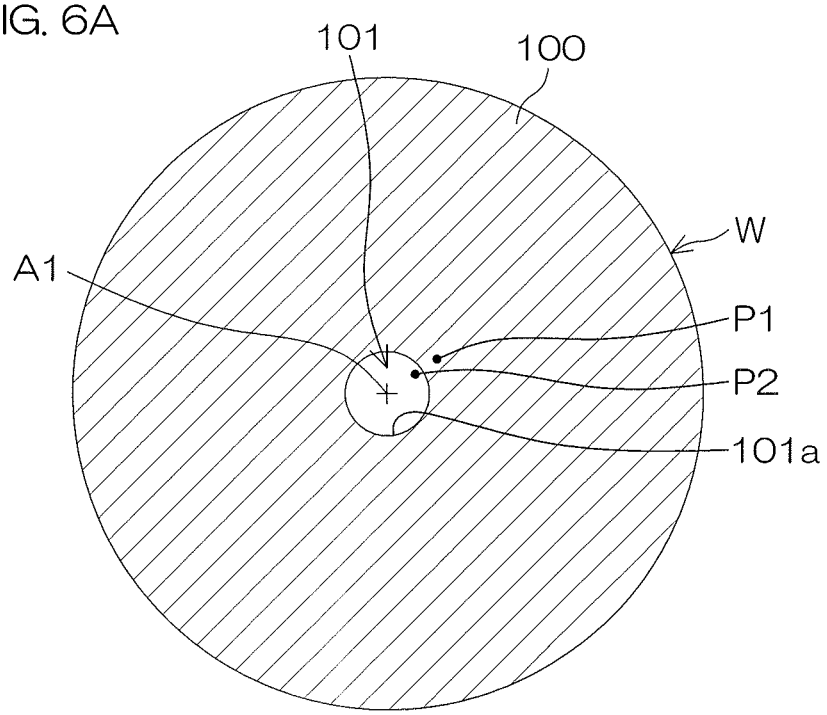
FIG. 6A is a plan view showing the state of a liquid film in an opening forming step of the substrate processing.

Specifically, the electric motor 23 accelerates rotation of the substrate W until the rotational speed of the substrate W reaches 1000 rpm, for example. Also, the aperture of the second gas valve 82 is adjusted such that the gas is blown into the center region of the liquid film 100. The flow rate of the gas discharged from the second gas nozzle 80 is thereby increased. As shown in FIG. 5D, the gas discharged from the second gas nozzle 80 forms a circular shaped opening 101, in plan view in the center region of the liquid film 100 (opening forming step). The diameter of the opening 101 is about 30 mm, for example. When an opening 101 is formed, the liquid film 100 becomes annular (see FIG. 6A). The center region of the liquid film 100 is the region that overlaps with the center region of the upper surface of the substrate W, in plan view. When the opening 101 is formed, the aperture of the second gas valve 82 is adjusted and the flow rate of nitrogen gas discharged from the second gas nozzle 80 is reduced.

Figure 5E:
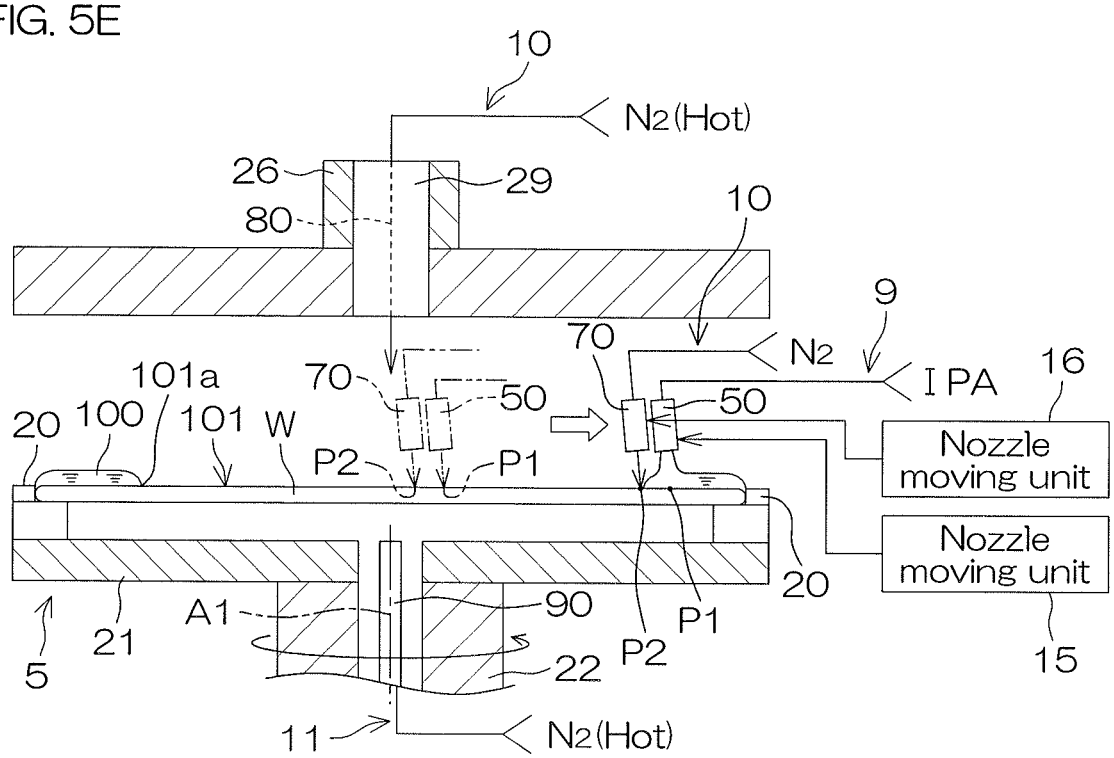

Also, as shown in FIG. 5E, the opening 101 is widened by centrifugal force due to rotation of the substrate W (opening widening step). In other words, the substrate rotating step is carried out in the opening widening step. When the opening widening step starts, the first gas valve 72 is opened. Nitrogen gas (gas) is thereby supplied to the upper surface of the substrate W from the first gas nozzle 70 positioned at the processing position. Also, when the opening widening step starts, the first organic solvent valve 52 is opened. IPA (organic solvent) is thereby supplied toward the upper surface of the substrate W from the first organic solvent nozzle 50 positioned at the processing position.

Supply of nitrogen gas from the heating fluid nozzle 90, which is started in organic solvent processing (S4), is continued as well in the opening widening step. That is, the substrate heating step is carried out in parallel with the opening widening step.

The processing position of the first gas nozzle 70 is set such that the gas discharged from the first gas nozzle 70 is blown further inward than a peripheral edge 101a of the opening 101. That is, the position where the nitrogen gas (gas) that has been discharged from the first gas nozzle 70 is supplied (blown) on the upper surface of the substrate W (a gas supply position P2) is set further inward than the peripheral edge 101a of the opening 101. Further inward than the peripheral edge 101a of the opening 101, means further to the radially inner side than the peripheral edge 101a of the opening 101, and further to the rotational axis A1 side than the peripheral edge 101a of the opening 101.

Figure 6B:
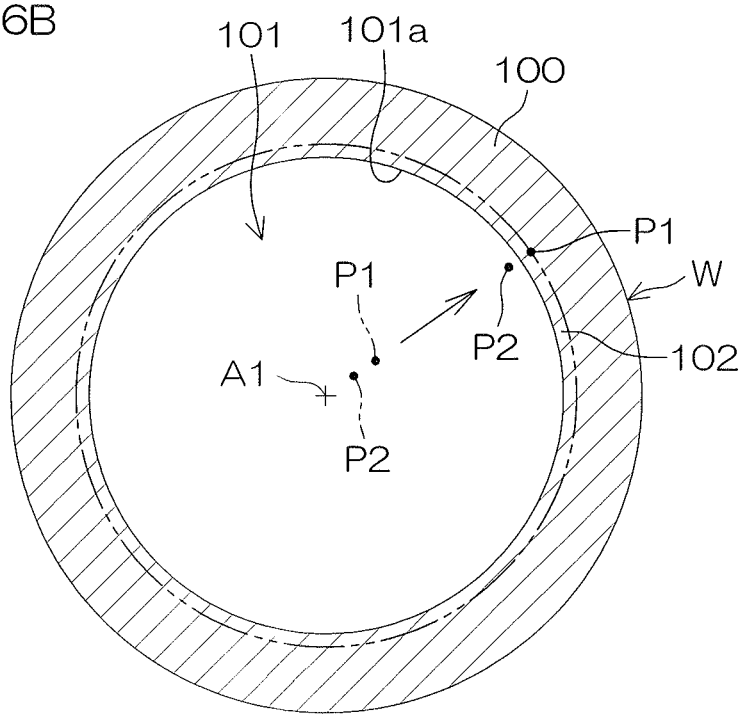
FIG. 6B is a plan view showing the state of the liquid film in the opening widening step.

Blowing force of the nitrogen gas discharged from the first gas nozzle 70 accelerates widening of the opening 101. The opening 101 is widened both by centrifugal force due to rotation of the substrate W, and by blowing force of the nitrogen gas. Moreover, since the substrate W rotates, the nitrogen gas discharged from the first gas nozzle 70 is blown uniformly over the entire region of the peripheral edge 101a of the opening 101. Consequently, the blowing force of nitrogen gas discharged from the first gas nozzle 70 can be made to act uniformly in the rotational direction with respect to the peripheral edge 101a of the opening 101 (the inner peripheral edge of the liquid film 100). The opening 101 is thereby widened while maintaining its circular shape, as shown in FIG. 6B.

On the other hand, the processing position of the first organic solvent nozzle 50 is set such that IPA discharged from the first organic solvent nozzle 50 lands further outward than the peripheral edge 101a of the opening 101. That is, the position where the IPA as the organic solvent (the low surface tension liquid) discharged from the first organic solvent nozzle 50 lands on the upper surface of the substrate W (a liquid landing position P1) is set to be further outward than the peripheral edge 101a of the opening 101. Further outward than the peripheral edge 101a of the opening 101, means further to the radially outer side than the peripheral edge 101a of the opening 101, and further to the peripheral edge side of the substrate W than the peripheral edge 101a of the opening 101.

In the opening widening step, the gas nozzle moving unit 16 moves the first gas nozzle 70 toward the peripheral edge of the substrate W (gas nozzle moving step). Thereby, as shown in FIG. 6B, the gas supply position P2 is moved toward the peripheral edge of the substrate W (gas supply position moving step). The gas nozzle moving unit 16 thus functions as a gas supply position moving unit. Moreover, in the opening widening step, the organic solvent nozzle moving unit 15 moves the first organic solvent nozzle 50 (the low surface tension liquid nozzle) toward the peripheral edge of the substrate W (low surface tension liquid nozzle moving step). Thereby, as shown in FIG. 6B, the liquid landing position P1 is moved toward the peripheral edge of the substrate W (liquid landing position moving step). The organic solvent nozzle moving unit 15 thus functions as a liquid landing position moving unit. As will be explained in greater detail below, in the opening widening step, the rotational speed of the substrate W and the movement speed of the liquid landing position P1 are varied in response to widening of the opening 101.

Due to widening of the opening 101, the liquid film 100 is removed from the upper surface of the substrate W. Discharge of IPA from the first organic solvent nozzle 50 is complete when the first organic solvent nozzle 50 has reached the peripheral edge of the substrate W. Discharge of nitrogen gas (gas) from the first gas nozzle 70 is completed when the liquid film 100 has been completely removed from the upper surface of the substrate W. That is, supply of nitrogen gas from the first gas nozzle 70 continues without interruption while the opening widening step is carried out (gas supply continuing step).

Discharge of nitrogen gas (heating fluid) from the heating fluid nozzle 90 is also completed when the liquid film 100 has been removed from the upper surface of the substrate W. Discharge of nitrogen gas (gas) from the second gas nozzle 80 is also completed when the liquid film 100 has been removed from the upper surface of the substrate W.

When the liquid film 100 is removed from the substrate W, the liquid component of the upper surface of the substrate W is shaken off by centrifugal force. Specifically, the facing member raising/lowering unit 27 moves the facing member 6 to the lower position. Also, the electric motor 23 makes the substrate W rotate at a high speed of 2000 rpm, for example. The substrate W is thereby dried.

The electric motor 23 then stops rotation of the spin chuck 5. Then, the facing member raising/lowering unit 27 moves the facing member 6 to the upper position. The opening/closing unit 24 then brings the chuck pins 20 into the open state. Thereafter, as shown in FIG. 1 as well, the transfer robot CR enters the processing unit 2 and scoops up the substrate W that has been processed from the spin chuck 5, carrying the processed substrate W out of the processing unit 2 (S7). The substrate W is delivered from the transfer robot CR to the transfer robot IR, and is housed in the carrier C by the transfer robot IR.

Figure 7:
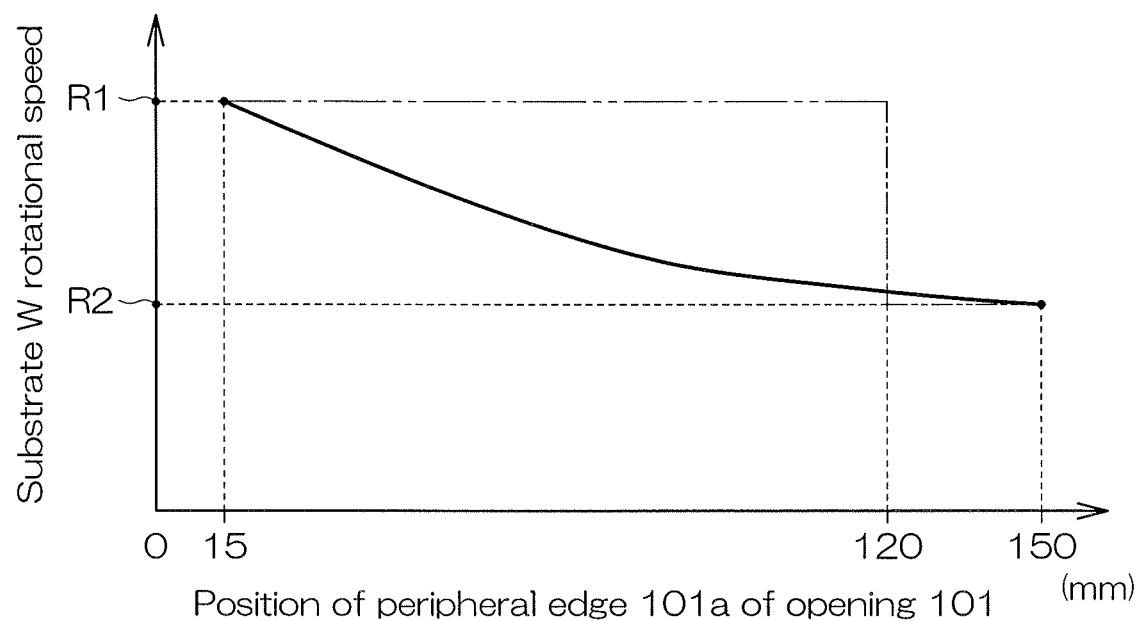
FIG. 7 is a graph for describing change in the rotational speed of the substrate in the opening widening step.

The opening widening step will now be explained in detail. As described above, in the opening widening step, the rotational speed of the substrate W is varied in response to widening of the opening 101. FIG. 7 is a graph for describing change in the rotational speed of the substrate W in the opening widening step. In FIG. 7, the position of the peripheral edge 101a of the opening 101 on the upper surface of the substrate W is shown on a horizontal axis. The position of the rotational axis A1 is the origin of the horizontal axis. In FIG. 7, the rotational speed of the substrate W is shown on an ordinate vertical axis. The rotational speed of the substrate W at the start of the opening widening step is designated as a first rotational speed R1. Also, the rotational speed of the substrate W at the end of the opening widening step is designated as a second rotational speed R2. The second rotational speed R2 is lower than the first rotational speed R1. In detail, the first rotational speed R1 is 1000 rpm, for example, and the second rotational speed R2 is 400 rpm to 500 rpm, for example.

In the opening widening step, rotation of the substrate W is decelerated in response to widening of the opening 101, until the rotational speed of the substrate W reaches the second rotational speed R2. Specifically, rotation of the substrate W is not rapidly decelerated at the point when the peripheral edge 101a of the opening 101 reaches a specific position on the upper surface of the substrate W (the point where a predetermined time has elapsed). That is, rotation of the substrate W is decelerated such that the rotational speed of the substrate W gradually falls as the peripheral edge 101a of the opening 101 approaches the peripheral edge of the upper surface of the substrate W. The rotational speed of the substrate W is decelerated in response to widening of the opening 101 even in the region between the center region and the peripheral edge region of the upper surface of the substrate W (the outer peripheral region).

Thus, in the substrate rotating step, a rotation deceleration step of decelerating rotation of the substrate W is carried out, such that the rotational speed of the substrate W when the peripheral edge 101a of the opening 101 is positioned in the peripheral edge region of the upper surface of the substrate W is lower than the rotational speed of the substrate W when the peripheral edge 101a of the opening 101 is positioned in the center region of the upper surface of the substrate W. Different from this preferred embodiment, rotation of the substrate W may instead be rapidly decelerated at the point when the peripheral edge 101a of the opening 101 has reached a specific position on the upper surface of the substrate W (for example, a position 120 mm from the center of rotation), as indicated by the alternate long and two short dashes line in FIG. 7.

Figure 8:
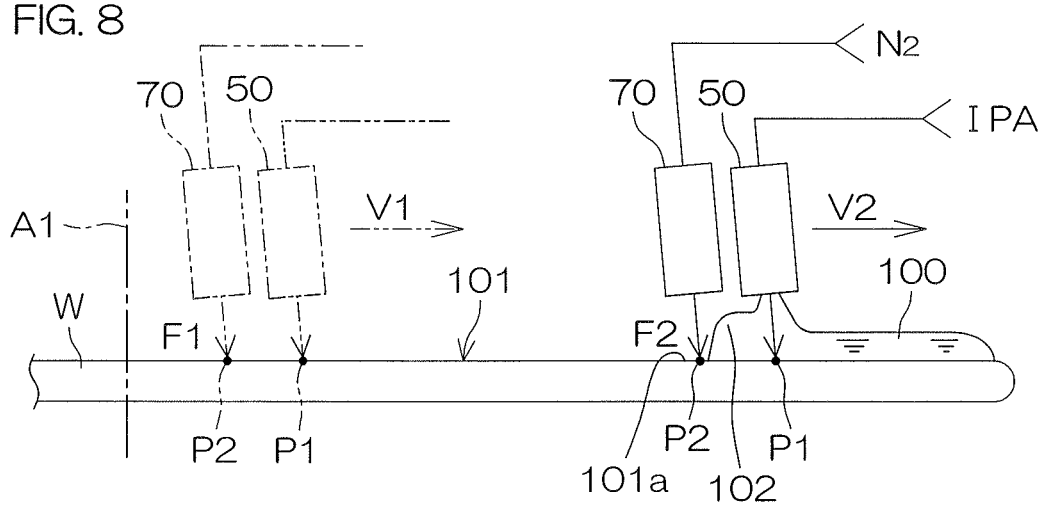
FIG. 8 is a schematic diagram for describing the states of an organic solvent supply unit and a gas supply unit in the opening widening step.

FIG. 8 is a schematic diagram for describing the states of the first organic solvent nozzle 50 and the first gas nozzle 70 in the opening widening step.

In the gas supply position moving step, gas is discharged from the first gas nozzle 70 toward the inclined direction D2 (gas inclined discharge step). As described above, gas discharged from the first gas nozzle 70 is supplied further inward than the peripheral edge 101a of the opening 101. Gas discharged from the first gas nozzle 70 is preferably supplied toward a position close to an intersection position of the gas-liquid interface of the liquid film 100 and the upper surface of the substrate W. The blowing force can thereby be made to sufficiently act on the liquid film 100 in the gas supply position moving step. Also, the portion of the upper surface of the substrate W where the liquid film 100 has been removed can thereby be dried promptly.

In the liquid landing position moving step, IPA is discharged from the first organic solvent nozzle 50 in the inclined direction D1 (low surface tension liquid inclined discharge step). As described above, IPA discharged from the first organic solvent nozzle 50 is supplied further outward than the peripheral edge 101a of the opening 101. The IPA discharged from the first organic solvent nozzle 50 is preferably supplied toward the inner peripheral edge of the liquid film 100. Thereby, in the liquid landing position moving step, the liquid landing position P1 can thereby be moved while forming the liquid buildup 102 on the inner peripheral edge of the liquid film 100 (see FIG. 6B as well). In particular, the IPA is more preferably supplied toward a position close to an intersection position of the gas-liquid interface and the upper surface of the substrate W. The liquid buildup 102 can thereby be formed at a position near the peripheral edge 101a of the opening 101.

The movement speed of the liquid landing position P1 when the first organic solvent nozzle 50 moves over the center region of the upper surface of the substrate W is designated as a first movement speed V1. Also, the movement speed of the liquid landing position P1 when the first organic solvent nozzle 50 moves over the peripheral edge region of the upper surface of the substrate W is designated as a second movement speed V2. In response to widening of the substrate W, the organic solvent nozzle moving unit 15 decelerates movement of the first organic solvent nozzle 50 until the movement speed of the first organic solvent nozzle 50 reaches the second movement speed V2. Thereby, movement of the liquid landing position P1 is decelerated until the movement speed of the liquid landing position P1 reaches the second movement speed V2. Thus, in the liquid landing position moving step, a liquid landing position movement decelerating step of decelerating movement of the liquid landing position P1 is carried out, such that the movement speed of the liquid landing position P1 when the liquid landing position P1 is positioned in the peripheral edge region of the upper surface of the substrate W (the second movement speed V2) is lower than the movement speed of the liquid landing position P1 when the liquid landing position P1 is positioned in the center region of the upper surface of the substrate W (the first movement speed V1).

Movement of the first gas nozzle 70 is also decelerated simultaneously with deceleration of movement of the first organic solvent nozzle 50. In detail, in response to widening of the substrate W, the gas nozzle moving unit 16 decelerates movement of the first gas nozzle 70 until the movement speed of the first gas nozzle 70 reaches the second movement speed V2. Thereby, movement of the gas supply position P2 is decelerated until the movement speed of the gas supply position P2 reaches the second movement speed V2. Thus, in the gas supply position moving step, a gas supply position decelerating step of decelerating the movement speed of the gas supply position P2 is carried out, such that the movement speed of the gas supply position P2 when the gas supply position P2 is positioned in the peripheral edge region of the upper surface of the substrate W (the second movement speed V2) is lower than the movement speed of the gas supply position P2 when the gas supply position P2 is positioned in the center region of the upper surface of the substrate W (the first movement speed V1).

Also, in the gas supply position moving step, the flow rate of nitrogen gas from the first gas nozzle 70 (the supply amount per unit time) is increased (supply amount increasing step). In detail, the aperture of the first gas valve 72 is adjusted in response to widening of the substrate W. In more detail, the flow rate of nitrogen gas discharged from the first gas nozzle 70 is increased from a first flow rate F1 to a second flow rate F2, in response to widening of the substrate W. Thus, in the gas supply position moving step, the flow rate of nitrogen gas from the first gas nozzle 70 when the peripheral edge 101a of the opening 101 is positioned in the peripheral edge region of the upper surface of the substrate W, is higher than the flow rate of nitrogen gas from the first gas nozzle 70 when the peripheral edge 101a of the opening 101 is positioned in the center region of the upper surface of the substrate W.

Similar to the flow rate of nitrogen gas from the first gas nozzle 70, in the opening widening step, the flow rate of high-temperature nitrogen gas supplied from the heating fluid nozzle 90 may be increased in response to widening of the substrate W.

As described above, according to this preferred embodiment, the substrate processing apparatus 1 includes the plurality of chuck pins 20 and the spin base 21 (substrate holding unit), the rinse liquid supply unit 8 (processing liquid supply unit), the organic solvent supply unit 9 (low surface tension liquid supply unit), the gas supply unit 10, the electric motor 23 (substrate rotating unit), the gas nozzle moving unit 16 (gas supply position moving unit), the organic solvent nozzle moving unit 15 (liquid landing position moving unit), and the controller 3.

The substrate holding step of horizontally holding the substrate W by the plurality of chuck pins 20 and the spin base 21, and the rinse liquid supply step of supplying the rinse liquid from the rinse liquid supply unit 8 toward the upper surface of the substrate W are carried out. Then the liquid film forming step of supplying an organic solvent from the organic solvent supply unit 9 toward the upper surface of the substrate W to replace the rinse liquid with the organic solvent, and thereby forming the liquid film 100 of the organic solvent on the upper surface of the substrate W is carried out. The opening forming step of supplying gas from the gas supply unit 10 to the center region of the liquid film 100, and thereby forming the opening 101 in the center region of the liquid film 100 is then carried out. Then, an opening widening step of widening the opening 101 is widened in order to remove the liquid film 100 is carried out.

In the opening widening step, the substrate rotating step of rotating the substrate W by the electric motor 23 is carried out. Also, the gas supply position moving step of supplying (blowing) gas from the gas supply unit 10 toward the gas supply position P2, and moving the gas supply position P2 toward the peripheral edge of the upper surface of the substrate W by the gas nozzle moving unit 16 is carried out. The liquid landing position moving step of supplying organic solvent from the organic solvent supply unit 9 toward the liquid landing position P1, and moving the liquid landing position P1 toward the peripheral edge of the upper surface of the substrate W by the organic solvent nozzle moving unit 15 is also carried out.

According to this configuration, the substrate rotating step, the gas supply position moving step and the liquid landing position moving step are carried out when the opening 101 formed in the liquid film 100 is widened to remove the liquid film 100 from the substrate W.

Due to rotation of the substrate W during widening of the opening 101, centrifugal force acts on the liquid film 100, and the liquid film 100 is extruded out of the substrate W. In the gas position moving step, the gas supply position P2 that is set further inward than the peripheral edge 101a of the opening 101 moves toward the peripheral edge of the upper surface of the substrate W. Therefore, the blowing force of the gas acts on the inner peripheral edge of the liquid film 100 during widening of the opening 101. When the blowing force of the gas acts on the inner peripheral edge of the liquid film 100, the liquid film 100 is even more reliably extruded out of the substrate W. Consequently, residue of droplets of the organic solvent in the region further inward than the peripheral edge 101a of the opening 101 is suppressed. That is, the region further inward than the peripheral edge 101a of the opening 101 can be satisfactorily dried.

On the other hand, in the liquid landing position moving step, the liquid landing position P1 that is set further outward than the peripheral edge 101a of the opening 101 moves toward the peripheral edge of the upper surface of the substrate W. The thickness of the liquid film 100 can therefore be adequately ensured. Consequently, thinning of the liquid film 100 near the opening 101 by centrifugal force and blowing force is suppressed. Consequently, the opening 101 can be widened at a uniform speed across the entire region in the direction of rotation.

As described above, the region further inward than the peripheral edge 101a of the opening 101 can be satisfactorily dried while widening the opening 101 at a uniform speed across the entire region in the direction of rotation. As a result, the low organic solvent on the substrate W can be satisfactorily removed.

In this preferred embodiment, the organic solvent is supplied from the organic solvent supply unit 9 in the liquid landing position moving step. The liquid landing position P1 can thereby be moved while forming the liquid buildup 102 on the inner peripheral edge of the liquid film 100. The thickness of the liquid film 100 can therefore be more adequately ensured near the peripheral edge 101a of the opening 101. In addition, since fresh IPA is supplied to the inner peripheral edge of the liquid film 100, temperature reduction at the inner peripheral edge of the liquid film 100 is suppressed.

Furthermore, in this preferred embodiment, while the opening widening step is carried out, a gas supply continuing step of continuing supply of the gas from the gas supply unit 10 is also carried out. Therefore, blowing force can be made to continuously act on the liquid film 100 during widening of the opening 101. Therefore, the region further inward than the peripheral edge 101a of the opening 101 can be even more satisfactorily dried.

Incidentally, when the peripheral edge 101a of the opening 101 approaches the peripheral edge 101a of the upper surface of the substrate W due to widening of the opening 101, the overall amount of IPA on the substrate W is reduced. Consequently, when the peripheral edge 101a of the opening 101 approaches the peripheral edge of the upper surface of the substrate W, the temperature of the liquid film 100 tends to be lowered. The surface tension exerted by the IPA on the upper surface of the substrate W increases when the temperature at the inner peripheral edge of the liquid film 100 increases. When the temperature of the liquid film 100 falls, surface tension acting on the pattern formed on the upper surface of the substrate W (see FIG. 14) increases, the pattern thereby becomes likely to collapse. In addition, the substrate W is less likely to be dried, due to lowering of the temperature of the liquid film 100. This may prevent satisfactory drying of the peripheral edge region of the upper surface of the substrate W.

Therefore, in this preferred embodiment, a rotation deceleration step of decelerating rotation of the substrate W by the electric motor 23 is carried out. The liquid film 100 can thereby be increased in thickness when the peripheral edge 101a of the opening 101 has approached the peripheral edge of the upper surface of the substrate W. Therefore, the decrease in IPA present on the substrate W, that is caused when the peripheral edge 101a of the opening 101 approaches the peripheral edge of the upper surface of the substrate W, can be suppressed. Thereby, the reduction in temperature of the liquid film 100, that is caused when the peripheral edge 101a of the opening 101 approaches the peripheral edge of the upper surface of the substrate W, can be suppressed. Consequently, the peripheral edge region of the upper surface of the substrate W can be satisfactorily dried.

Moreover, in this preferred embodiment, rotation of the substrate W is decelerated by the electric motor 23 in the rotation deceleration step, such that the rotational speed of the substrate W decreases as the peripheral edge 101a of the opening 101 approaches the peripheral edge of the upper surface of the substrate W.

According to this configuration, the liquid film 100 can be gradually increased in thickness as the peripheral edge 101a of the opening 101 approaches the peripheral edge of the upper surface of the substrate W. Therefore, the decrease in IPA present on the substrate W that is caused when the peripheral edge 101a of the opening 101 approaches the peripheral edge of the upper surface of the substrate W can be suppressed, even when the peripheral edge 101a of the opening 101 is positioned in the outer peripheral region. Consequently, change in the temperature of the liquid film 100 can be suppressed, even when the position of the peripheral edge 101a of the opening 101 is at any position of the upper surface of the substrate W. As a result, the liquid film 100 on the substrate W can be satisfactorily removed, across the entire region of the upper surface of the substrate W.

Incidentally, when the IPA lands on the liquid film 100, the IPA may splash and adheres further onto the inner side of the upper surface of the substrate W than the opening 101. Therefore, in this preferred embodiment, in the gas supply position moving step, the gas inclined discharge step of discharging gas in the inclined direction D2 by the first gas nozzle 70 of the gas supply unit 10 is carried out. Then, in the gas supply position moving step, the gas nozzle moving step of moving the first gas nozzle 70 by the gas nozzle moving unit 16 of the gas supply unit 10 is carried out. Therefore, the IPA that has splashed when the organic solvent lands on the liquid film 100 is pushed back by the gas before the IPA adheres further onto the inner side of the upper surface of the substrate W than the peripheral edge 101a of the opening 101, and thus lands again on the liquid film 100. Therefore, the liquid film 100 on the substrate W can be satisfactorily removed.

As the temperature of the liquid film 100 rises, surface tension acting on the pattern formed on the upper surface of the substrate W (see FIG. 14) decreases. A higher temperature of the liquid film 100 increases the drying speed of the upper surface of the substrate W. Therefore in this preferred embodiment, the substrate processing apparatus 1 further includes the heating fluid supply unit 11 (the substrate heating unit). Also, the substrate heating step of heating the substrate W by the heating fluid supply unit 11 is carried out in parallel with the opening widening step. Lowering of the temperature of the liquid film 100 can thereby be suppressed. Alternatively, the temperature of the liquid film 100 can be increased. The drying speed of the upper surface of the substrate W is therefore increased. Further, pattern collapse is suppressed. Therefore, the liquid film 100 on the substrate W can be satisfactorily removed.

Furthermore, in this preferred embodiment, in the liquid landing position moving step, the low surface tension liquid inclined discharge step of discharging IPA as the organic solvent (the low surface tension liquid) in the inclined direction D1 by the first organic solvent nozzle 50 of the organic solvent supply unit 9 is carried out. Then, in the liquid landing position moving step, a low surface tension liquid nozzle moving step of moving the first organic solvent nozzle 50 by the organic solvent nozzle moving unit 15 of the organic solvent supply unit 9 is carried out. Therefore, the direction in which the IPA splashes when the organic solvent lands on the liquid film 100 can be directed toward the peripheral edge side of the substrate W. This can suppress splashing of the IPA and adhesion of the IPA further inward than the opening 101 on the upper surface of the substrate W, when the IPA lands on the liquid film 100.

In addition, according to this preferred embodiment, the liquid landing position movement decelerating step of decelerating movement of the liquid landing position P1 is carried out in the liquid landing position moving step. Thereby, it is possible to increase the total amount of the IPA supplied to the liquid film 100 when the peripheral edge 101a of the opening 101 is positioned in the peripheral edge region of the upper surface of the substrate W. Therefore, even when heat amount of the liquid film 100 on the substrate W has been drawn out by the substrate W, the heat amount can be supplemented by IPA freshly supplied to the liquid film 100. Thereby, the reduction in temperature of the liquid film 100, that is caused when the peripheral edge 101a of the opening 101 approaches the peripheral edge of the upper surface of the substrate W, can be suppressed. Therefore, the liquid film 100 on the substrate W can be satisfactorily removed.

Here, as the peripheral edge 101a of the opening 101 approaches the peripheral edge of the upper surface of the substrate W, the distance through which the gas supply position P2 undergoes relative movement on the upper surface of the substrate W in the rotational direction per unit time is increased. That is, the amount of gas blown from the first gas nozzle 70 per unit area is decreased. Consequently, when the first gas nozzle 70 has been moved at a constant speed toward the peripheral edge of the upper surface of the substrate W, the drying efficiency of the substrate W decreases as the peripheral edge 101a of the opening 101 approaches the peripheral edge of the upper surface of the substrate W.

Therefore, in the first preferred embodiment, the gas supply position decelerating step of decelerating movement of the gas supply position P2 is carried out in the gas supply position moving step. The peripheral edge region of the upper surface of the substrate W can thereby be dried sufficiently.

Moreover, in the first preferred embodiment, the supply amount increasing step of increasing the flow rate of nitrogen gas from the first gas nozzle 70 (the supply amount per unit time) is carried out in the gas supply position moving step. The peripheral edge region of the upper surface of the substrate W can thereby be dried sufficiently.

Furthermore, as the peripheral edge 101a of the opening 101 approaches the peripheral edge of the substrate W, the distance through which the liquid landing position P1 moves relative to the substrate W in the rotational direction per unit time increases. Consequently, when IPA is supplied to the substrate W from the first organic solvent nozzle 50, the energy and amount of IPA splashing from the liquid film 100 increases. However, since the supply amount increasing step is carried out in the first preferred embodiment, even when the peripheral edge 101a of the opening 101 moves to the peripheral edge of the substrate W and the energy and amount of IPA splashing from the liquid film 100 has increased, the splashed IPA can be pushed back further outward than the peripheral edge 101a of the opening 101.

Moreover, according to the first preferred embodiment, the interior space 14A of the chamber 14 is replaced by nitrogen gas before the liquid film 100 is formed. This reduces the humidity of the interior space 14A and therefore the humidity in the atmosphere near the upper surface of the substrate W. Consequently, by carrying out the opening forming step and the opening widening step, adhesion of water on the exposed substrate W can be suppressed. The substrate W is therefore satisfactorily dried.

A higher temperature of the organic solvent increases the displacement efficiency of the rinse liquid by the organic solvent. According to the first preferred embodiment, the temperature of the IPA discharged from the second organic solvent nozzle 60 is either at the boiling point or slightly lower than the boiling point. Thus, the DIW (the rinse liquid) can be efficiently replaced with the IPA (the organic solvent). Also, the time required to raise the temperature of the liquid film 100 by heating with the heating fluid supply unit 11 is shortened. In other words, the liquid film 100 at a sufficiently high temperature is formed in a short period of time.

Furthermore, since heat of vaporization is generated when the organic solvent volatilizes, the temperature of the liquid film 100 on the substrate W tends to be lowered. According to the first preferred embodiment, the temperature of the IPA discharged from the first organic solvent nozzle 50 is also either at the boiling point or slightly lower than the boiling point. Therefore, in the opening widening step, IPA at the boiling point or slightly below the boiling point is constantly replenished on the liquid film 100, and lowering of the temperature of the liquid film 100 by volatilization can thereby be suppressed.

The configuration of the substrate processing apparatus 1 of the first preferred embodiment and substrate processing by the substrate processing apparatus 1 of the first preferred embodiment were explained above, but the substrate processing apparatus 1 of the first preferred embodiment may have the following configuration, and substrate processing may be carried out in the following manner.

For example, if high-temperature DIW is used as the rinse liquid, different from the substrate processing described above, temperature reduction of the IPA on the substrate W can be suppressed when the high-temperature DIW is supplied from the second organic solvent nozzle 60 to the upper surface of the substrate W to replace the rinse liquid with the organic solvent. By suppressing temperature reduction of the IPA, the DIW can be more efficiently replaced with the IPA. The time until replacement of DIW with IPA can therefore be further shortened.

In the first preferred embodiment, the first organic solvent nozzle 50 discharges the organic solvent in the inclined direction D1. However, the configuration may instead be such that the first organic solvent nozzle 50 discharges the organic solvent in the vertical direction (downward), different from the first preferred embodiment. Moreover, in the first preferred embodiment, the first gas nozzle 70 discharges the gas in the inclined direction D2. However, the configuration may instead be such that the first gas nozzle 70 discharges the gas in the vertical direction (downward), different from the first preferred embodiment.

In substrate processing by the substrate processing apparatus 1 of the first preferred embodiment, the first organic solvent nozzle 50 and the first gas nozzle 70 are simultaneously decelerated. However, the first organic solvent nozzle 50 and first gas nozzle 70 may instead be decelerated at different timings. The first organic solvent nozzle 50 and first gas nozzle 70 may have movement speeds which differ to each other.

In addition, in the first preferred embodiment, the first organic solvent nozzle 50 and first gas nozzle 70 are moved by moving units which differ to each other. However, the configuration may instead such that the first organic solvent nozzle 50 and first gas nozzle 70 are integrally moved by a common nozzle moving unit, different from the first preferred embodiment.

Also, as shown in FIG. 5C and FIG. 5D, the organic solvent may be discharged from the first organic solvent nozzle 50 when the opening 101 is formed. That is, the low surface tension liquid supply step may be carried out in parallel with the opening forming step. The thickness of the liquid film 100 can thereby be adequately ensured near the peripheral edge 101a of the opening 101 when forming the opening 101. Therefore, even if the IPA near the peripheral edge 101a of the opening 101 has been pushed away due to supply of the gas during formation of the opening, the thickness of the liquid film 100 near the peripheral edge 101a of the opening 101 is adequately maintained.

Second Preferred Embodiment

Figure 9:
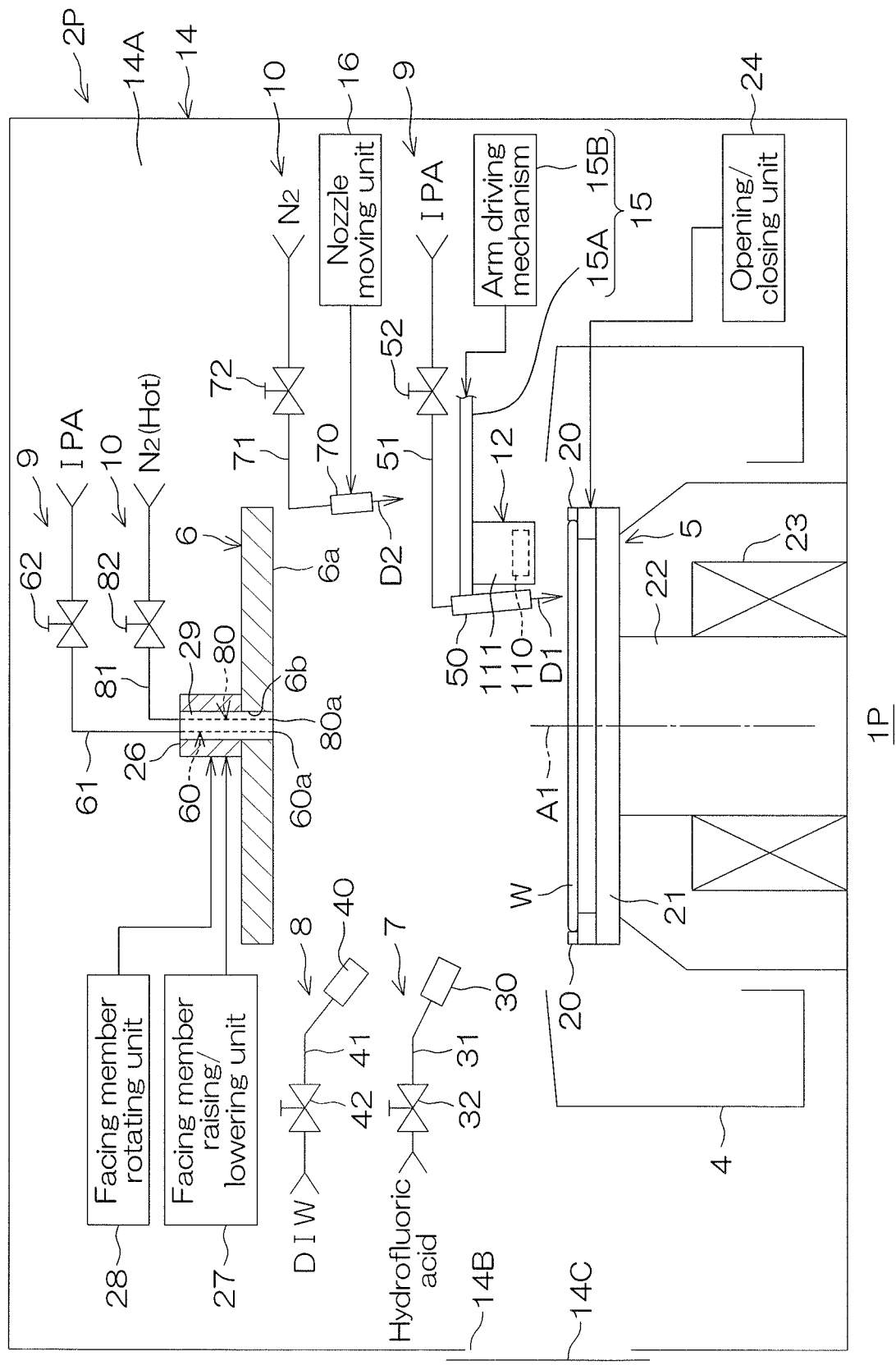
FIG. 9 is an illustrative cross-sectional view for describing a configuration example of a processing unit included in a substrate processing apparatus according to a second preferred embodiment.
Figure 10A:
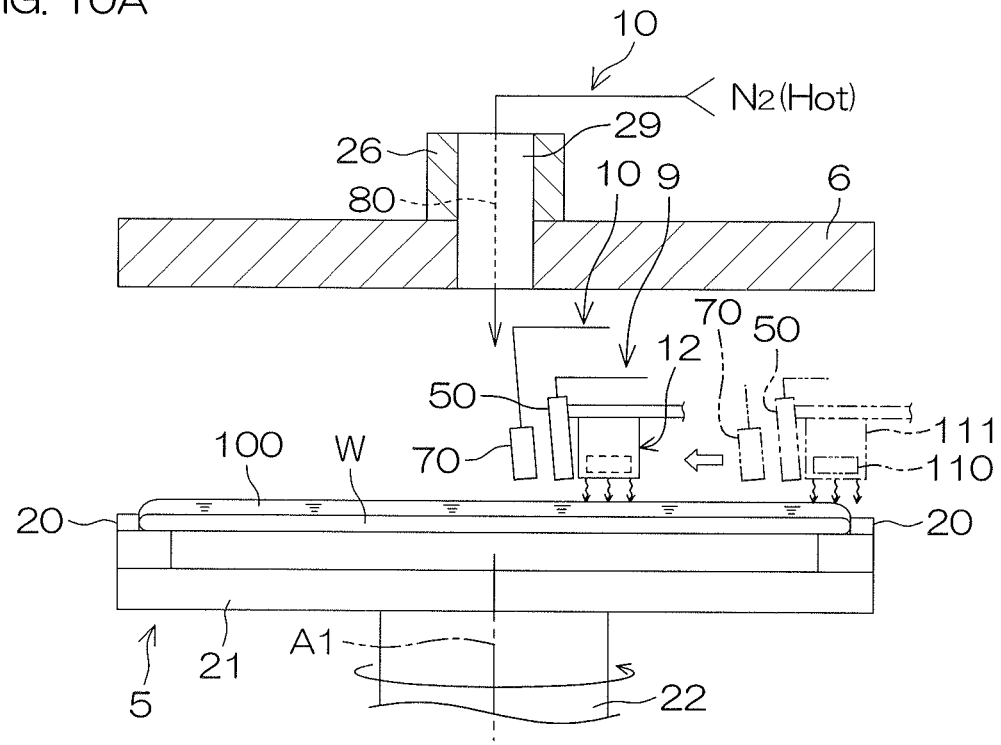
FIGS. 10A to 10C are illustrative cross-sectional views for describing an example of substrate processing by a substrate processing apparatus according to the second preferred embodiment.
Figure 10B:
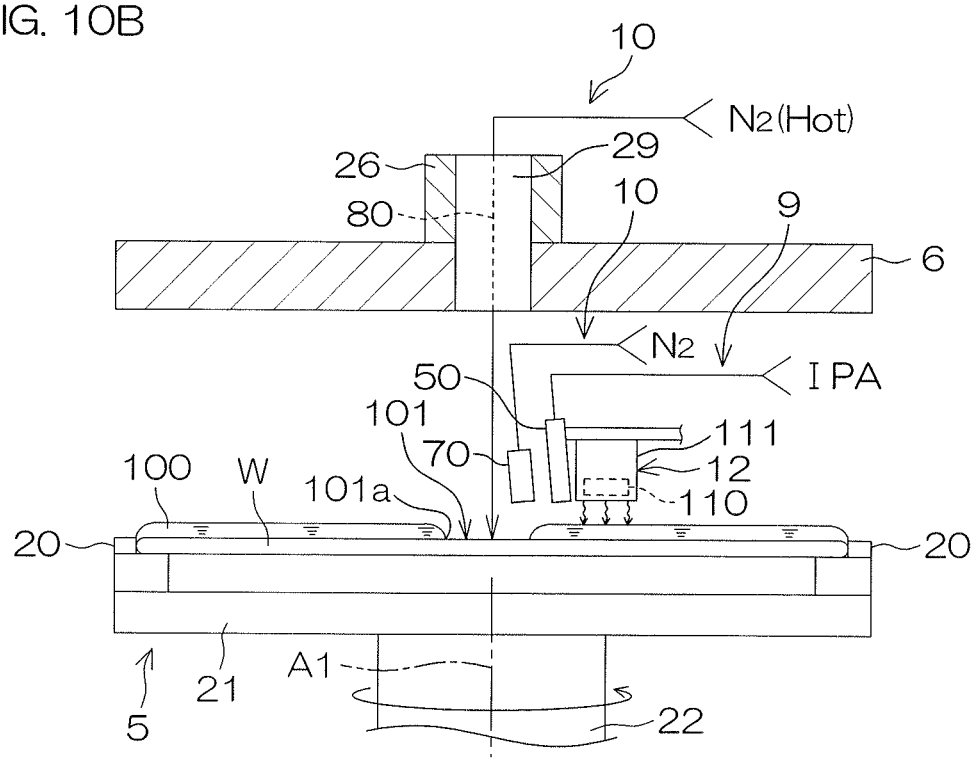
Figure 10C:
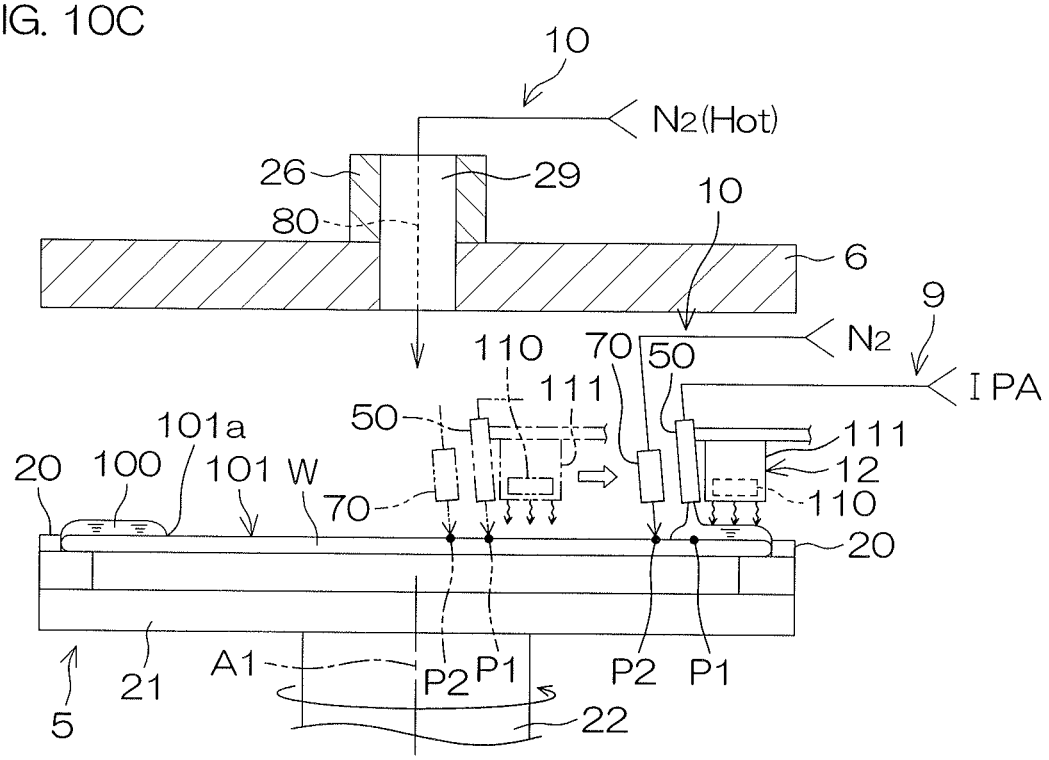

FIG. 9 is an illustrative cross-sectional view for describing a configuration example of a processing unit 2P included in a substrate processing apparatus 1P according to a second preferred embodiment. FIGS. 10A to 10C are illustrative cross-sectional views for describing an example of substrate processing by the substrate processing apparatus 1P. In FIG. 9 to FIG. 10C, the same members as those explained above are indicated by the same reference numerals, and their explanation will be omitted.

The major point in which the substrate processing apparatus 1P differs from the substrate processing apparatus 1 of the first preferred embodiment (see FIG. 2) is that the processing unit 2P includes an infrared heater unit 12 for heating of the substrate W, instead of the heating fluid supply unit 11. The infrared heater unit 12 is an example of the substrate heating unit.

The infrared heater unit 12 includes an infrared lamp 110 that emits infrared rays, and a lamp housing 111 that houses the infrared lamp 110. The infrared lamp 110 is disposed inside the lamp housing 111. The infrared lamp 110 includes, for example, a filament, and a quartz tube that houses the filament.

The infrared lamp 110 is moved in the horizontal direction and the vertical direction by the organic solvent nozzle moving unit 15. In detail, the organic solvent nozzle moving unit 15 includes an arm 15A that supports the first organic solvent nozzle 50, and an arm driving mechanism 15B that drives the arm 15A. The lamp housing 111 is supported by the arm 15A, together with the first organic solvent nozzle 50.

The infrared lamp 110 is moved in the horizontal direction between a center position and a home position (retreat position) by the organic solvent nozzle moving unit 15. When the infrared lamp 110 is positioned at the center position, the region of the upper surface of the substrate W irradiated by the infrared rays is positioned in the center region of the upper surface of the substrate W. When the infrared lamp 110 is positioned at the retreat position, the infrared lamp 110 is positioned further to the radially outer side than the cup 4. The infrared lamp 110 is controlled by the controller 3 (see FIG. 3). The lamp housing 111 is supported by the arm 15A such that the lamp housing 111 is positioned further to the radially outer side than the first organic solvent nozzle 50.

In substrate processing by the substrate processing apparatus 1P, the infrared heater unit 12 is used instead of the heating fluid supply unit 11. When the first organic solvent nozzle 50 is moved to the processing position after formation of the liquid film 100, as shown in FIG. 10A, heating of the substrate W (the liquid film 100) by the infrared lamp 110 is started.

Also, when the opening 101 is formed, as shown in FIG. 10B, the inner peripheral edge of the liquid film 100 is heated by the infrared lamp 110 (inner peripheral edge heating step). Furthermore, since the lamp housing 111 is positioned further to the radially outer side than the first organic solvent nozzle 50, the infrared lamp 110 faces the liquid film 100 in the opening widening step, as shown in FIG. 10C.

When the lamp housing 111 is positioned further to the radially inner side than the first organic solvent nozzle 50, different from the second preferred embodiment, the infrared lamp 110 faces the portion of the upper surface of the substrate W further inward than the opening 101 in the opening widening step. On the other hand, in the second preferred embodiment, the lamp housing 111 is positioned further to the radially outer side than the first organic solvent nozzle 50. Therefore, the liquid film 100 can be directly heated by the infrared heater unit 12 in the opening widening step. Lowering of the temperature of the liquid film 100 can thereby be suppressed. Therefore, lowering of the temperature of the liquid film 100 can be further suppressed.

The second preferred embodiment also exhibits the same effect as the first preferred embodiment.

The substrate processing apparatus 1P of the second preferred embodiment may include a heating fluid supply unit 11 in addition to the infrared heater unit 12. By using the infrared heater unit 12 and heating fluid supply unit 11 in combination, the substrate W and the liquid film 100 can be adequately heated.

Third Preferred Embodiment

Figure 11:
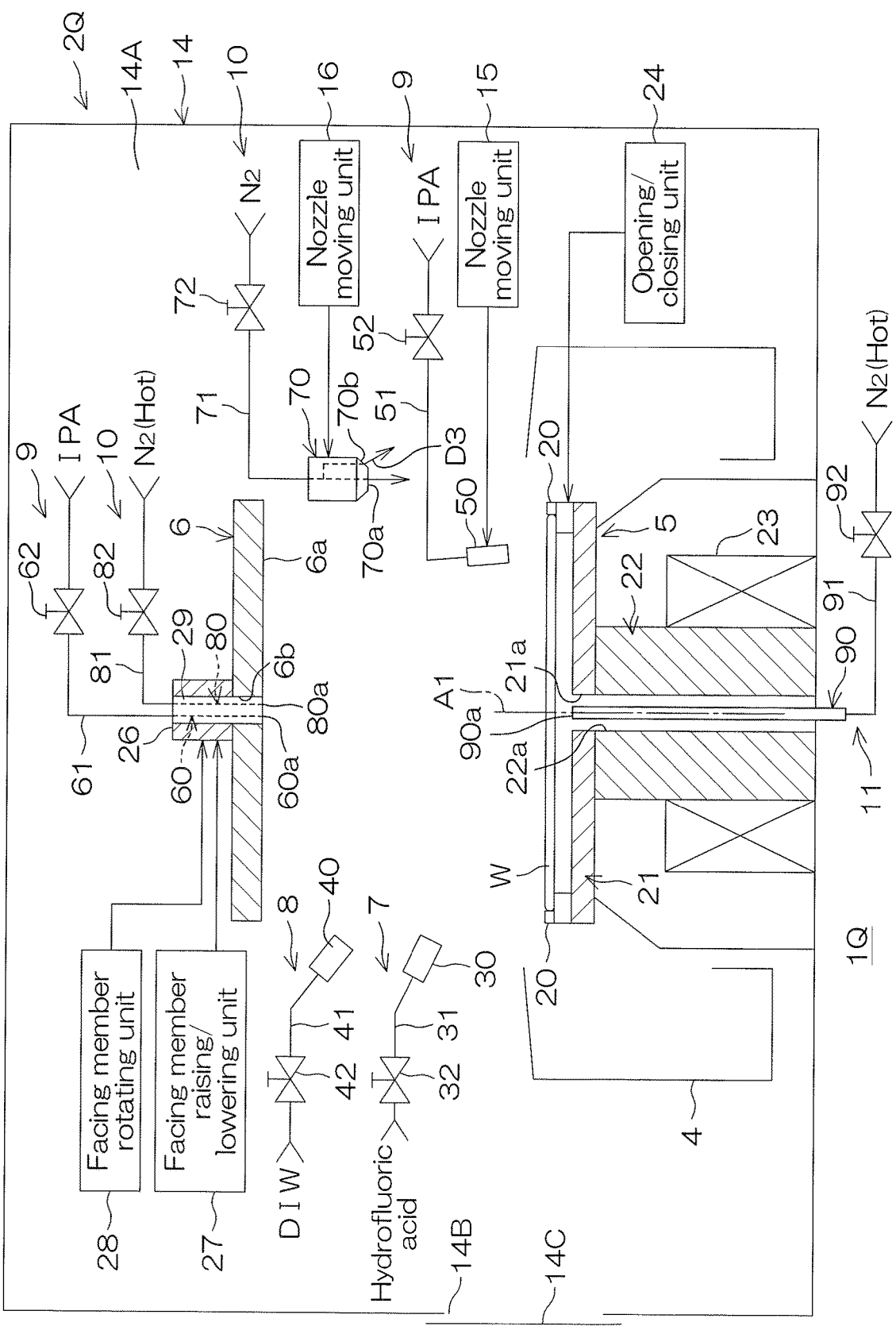
FIG. 11 is an illustrative cross-sectional view for describing a configuration example of a processing unit included in a substrate processing apparatus according to a third preferred embodiment.
Figure 12:
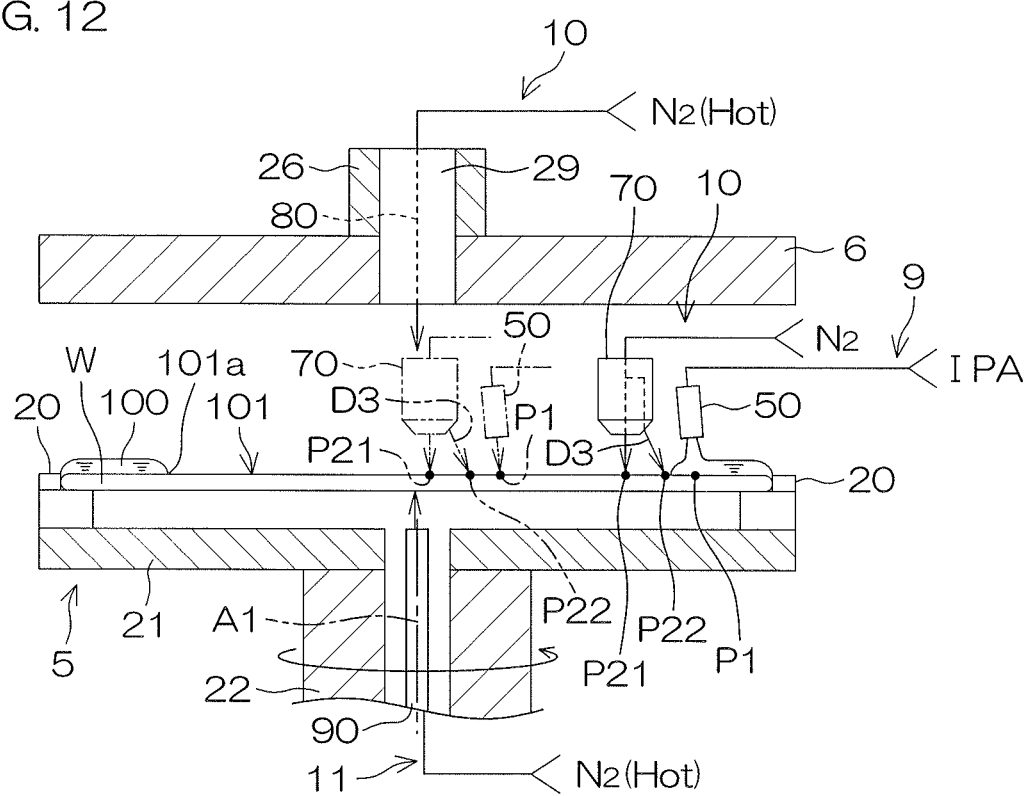
FIG. 12 is an illustrative cross-sectional view for describing an example of substrate processing by a substrate processing apparatus according to the third preferred embodiment.

FIG. 11 is an illustrative cross-sectional view for describing a configuration example of a processing unit 2Q included in a substrate processing apparatus 1Q according to a third preferred embodiment. FIG. 12 is an illustrative cross-sectional view for describing an example of substrate processing by the substrate processing apparatus 1Q. In FIG. 11 and FIG. 12, the same members as those explained above are indicated by the same reference numerals, and their explanation will be omitted.

The major point in which the substrate processing apparatus 1Q differs from the substrate processing apparatus 1 of the first preferred embodiment (see FIG. 2) is that the first gas nozzle 70 of the gas supply unit 10 has a vertical discharge port 70a and an inclined discharge port 70b.

The vertical discharge port 70a is a discharge port that discharges gas downward. The inclined discharge port 70b discharges gas in an inclined direction D3. The inclined direction D3 is a direction that is inclined with respect to the vertical direction so as to approach the peripheral edge of the upper surface of the substrate W as it goes downward. An intersection angle between a straight line extending in the inclined direction D3 and a straight line extending in the vertical direction is 5° to 45°, for example. For convenience of illustration, the intersection angle between the straight line extending in the inclined direction D3 and the straight line extending in the vertical direction is shown as an angle smaller than 45°, but the intersection angle is preferably 45°.

Referring to FIG. 12, in the opening widening step in the substrate processing by the substrate processing apparatus 1Q, the gas is discharged from the first gas nozzle 70 in both the vertical direction and the inclined direction D3 (gas inclined discharge step). The position on the upper surface of the substrate W where the gas is supplied from the vertical discharge port 70a is designated as a first gas supply position P21. The position on the upper surface of the substrate W where the gas is supplied from the inclined discharge port 70b is designated as a second gas supply position P22. The first gas supply position P21 and the second gas supply position P22 are set further inward than the peripheral edge 101a of the opening 101. In the gas supply position moving step, the first gas supply position P21 and second gas supply position P22 move toward the peripheral edge of the substrate W.

Gas that is discharged from the first gas nozzle 70 in the vertical direction is blown further inward on the upper surface of the substrate W than the peripheral edge 101a of the opening 101. Thereby, the region of the upper surface of the substrate W further inward than the peripheral edge 101a of the opening 101 is even more satisfactorily dried. On the other hand, gas discharged from the first gas nozzle 70 in the inclined direction D3 pushes back IPA that has splashed when the IPA lands on the liquid film 100, before the IPA adheres further onto the inner side of the upper surface of the substrate W than the opening 101. The IPA pushed back by the gas that has been discharged in the inclined direction D3 lands again on the liquid film 100. Therefore, the liquid film 100 on the substrate W can be satisfactorily removed.

The third preferred embodiment also exhibits the same effect as the first preferred embodiment.

The first gas nozzle 70 may have 3 or more discharge ports, different from the third preferred embodiment. The first gas nozzle 70 may be a shower nozzle having a plurality of discharge ports that discharge gas in the form of a shower. If the first gas nozzle 70 is a shower nozzle, in the gas supply position moving step, the upper surface of the substrate W can be dried while replacing the atmosphere near the peripheral edge 101a of the opening 101 with a gas such as nitrogen gas. The upper surface of the substrate W can thereby be even more satisfactorily dried.

Fourth Preferred Embodiment

Figure 13:
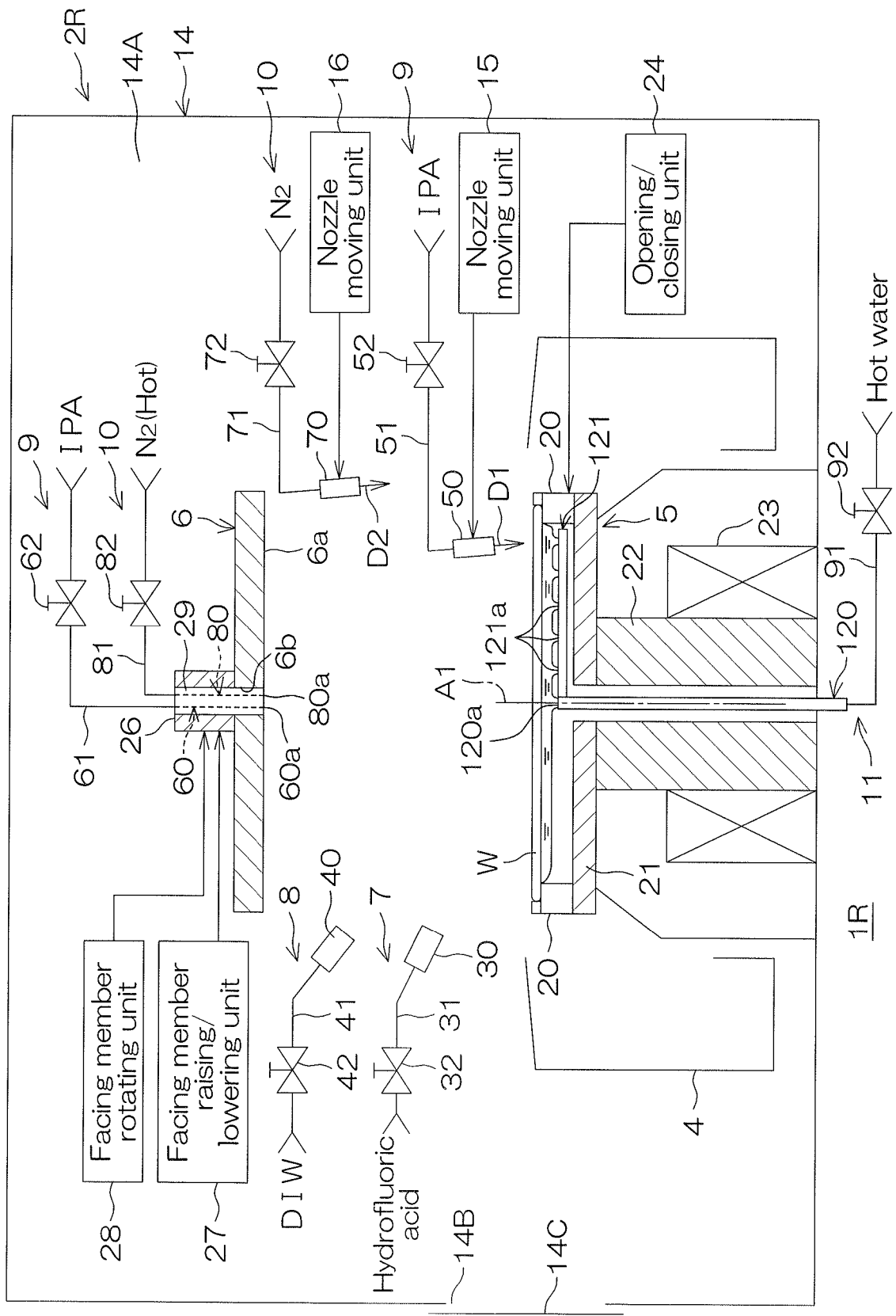
FIG. 13 is an illustrative cross-sectional view for describing a configuration example of a processing unit included in a substrate processing apparatus according to a fourth preferred embodiment.

FIG. 13 is an illustrative cross-sectional view for describing a configuration example of a processing unit 2R included in a substrate processing apparatus 1R according to a fourth preferred embodiment. In FIG. 13, the same members as those explained above are indicated by the same reference numerals, and their explanation will be omitted.

The major point in which the substrate processing apparatus 1R differs from the substrate processing apparatus 1 of the first preferred embodiment (see FIG. 2) is that the heating fluid supply unit 11 includes a central fluid nozzle 120 and an annular fluid nozzle 121, instead of the heating fluid nozzle 90 (see FIG. 2). The central fluid nozzle 120 supplies heating fluid toward the center region of the lower surface of the substrate W. The annular fluid nozzle 121 supplies heating fluid to an annular region of the lower surface of the substrate W. The annular region of the lower surface of the substrate W is the region of the lower surface of the substrate W excluding the center region. In detail, the annular region of the lower surface of the substrate W is the region spanning from a predetermined position further outward than the center region up to the peripheral edge of the lower surface of the substrate W.

The central fluid nozzle 120 extends along the vertical direction. The central fluid nozzle 120 is inserted in the rotating shaft 22. The central fluid nozzle 120 has, at its upper end, a discharge port 120a facing the rotational center of the lower surface of the substrate W. The annular fluid nozzle 121 has a form of a bar nozzle extending from the tip of the central fluid nozzle 120 in the radial direction, and has a plurality of discharge ports 121a facing the annular region of the lower surface of the substrate W. The plurality of discharge ports 121a are respectively disposed at a plurality of positions at different distances from the rotational axis A1. The plurality of discharge ports 121a face the annular region of the lower surface of the substrate W by rotation of the substrate W around the rotational axis A1.

The heating fluid supply pipe 91 is connected to the lower end of the central fluid nozzle 120. A heating fluid such as hot water is supplied from a heating fluid supply source to the central fluid nozzle 120 and the annular fluid nozzle 121 via the heating fluid supply pipe 91. The heating fluid discharged from the discharge port 120a of the central fluid nozzle 120 and the plurality of discharge ports 121a of the annular fluid nozzle 121 is not limited to hot water. The heating fluid discharged from the discharge port 120a of the central fluid nozzle 120 and the plurality of discharge ports 121a of the annular fluid nozzle 121 may be any fluid which can heat the substrate W. For example, the heating fluid may be high-temperature nitrogen gas or steam. If the heating fluid is steam, the substrate W can be heated by a fluid at higher temperature than hot water.

The heating fluid discharged from the discharge port 120a of the central fluid nozzle 120 and the plurality of discharge ports 121a of the annular fluid nozzle 121 is transferred to the lower surface of the substrate Wand spreads outward by centrifugal force and forms a liquid film that covers the lower surface of the substrate W. The heating fluid that has been discharged from the plurality of discharge ports 120a, 121a arrives at each of the respective facing positions on the lower surface of the substrate W, and upon arrival, heat exchange between the heating fluid and the substrate W starts. Therefore, the entire region of the substrate W can be uniformly heated. The fourth preferred embodiment exhibits the same effect as the first preferred embodiment.

Also, since the heating fluid supply unit 11 can homogeneously heat the region from the rotational center to the peripheral edge of the substrate W, the organic solvent at the peripheral edge 101a of the opening 101 can be made to evaporate in a stable manner, even when the opening 101 has reached the peripheral edge region of the substrate W. Widening of the opening 101 can thereby be satisfactorily aided by heating of the substrate W.

The present invention is not restricted to the preferred embodiments described above and may be implemented in yet other modes.

For example, different from the substrate processing apparatus 1 of the first preferred embodiment, the gas supply unit may include a gas nozzle having a facing surface that faces part of the upper surface of the substrate W, instead of the first gas nozzle 70. In a state where this type of gas nozzle is brought near to the peripheral edge 101a of the opening 101, by discharging nitrogen gas (the gas) from the gas nozzle, a gas stream is formed from between the facing surface and the portion of the substrate W where the peripheral edge 101a of the opening 101 is positioned, toward the outside. IPA that has splashed from the liquid film 100 can therefore be easily pushed back further outward than the peripheral edge 101a of the opening 101.

While preferred embodiments of the present invention have been described in detail, these are merely specific examples used to clarify the technical contents of the present invention and the present invention should not be interpreted as being limited to these specific examples and the scope of the present invention are to be limited only by the appended claims.

The present application corresponds to Japanese Patent Application No. 2017-167680 filed on Aug. 31, 2017 in the Japan Patent Office, and the entire disclosure of this application is incorporated herein by reference.

What is claimed is:

1. A substrate processing method comprising:
a substrate holding step of holding a substrate horizontally;
a processing liquid supply step of supplying a water-containing processing liquid to an upper surface of the substrate;
a liquid film forming step of forming a liquid film of a low surface tension liquid, having a lower surface tension than water, that covers the upper surface, by supplying the low surface tension liquid to the upper surface of the substrate to replace the processing liquid on the substrate with the low surface tension liquid;
an opening forming step of supplying a gas to a center region of the liquid film to form an opening in the center region of the liquid film;
an opening widening step of widening the opening in order to remove the liquid film;
a substrate rotating step of rotating, in the opening widening step, the substrate around a predetermined rotational axis along a vertical direction;
a gas supply position moving step of blowing, in the opening widening step, the gas toward a gas supply position that is set further inward than a peripheral edge of the opening on the upper surface of the substrate, and moving the gas supply position toward the peripheral edge of the upper surface of the substrate; and a liquid landing position moving step of supplying, in the opening widening step, the low surface tension liquid toward a liquid landing position that is set further outward than the peripheral edge of the opening on the upper surface of the substrate, and moving the liquid landing position toward the peripheral edge of the upper surface of the substrate.

2. The substrate processing method according to claim 1, wherein the liquid landing position moving step includes a step of moving the liquid landing position while forming a liquid buildup at an inner peripheral edge of the liquid film by supply of the low surface tension liquid.

3. The substrate processing method according to claim 1, further comprising: in parallel with the opening forming step, a low surface tension liquid supply step of supplying the low surface tension liquid to the liquid film.

4. The substrate processing method according to claim 1, further comprising: a gas supply continuing step of continuing supply of the gas while the opening widening step is carried out.

5. The substrate processing method according to claim 1, wherein the substrate rotating step includes a rotation deceleration step of decelerating rotation of the substrate such that a rotational speed of the substrate when the peripheral edge of the opening is positioned in a peripheral edge region of the upper surface of the substrate is lower than the rotational speed of the substrate when the peripheral edge of the opening is positioned in the center region of the upper surface of the substrate.

6. The substrate processing method according to claim 1, wherein the gas supply position moving step includes a gas inclined discharge step of discharging the gas from a gas nozzle along an inclined direction that is inclined with respect to the vertical direction so as to approach the peripheral edge of the upper surface of the substrate as the inclined direction goes downward, and a gas nozzle moving step of moving the gas supply position by moving the gas nozzle toward the peripheral edge of the upper surface of the substrate.

7. The substrate processing method according to claim 1, further comprising: a substrate heating step of heating the substrate; and
wherein the substrate heating step is carried out in parallel with the opening widening step.

8. The substrate processing method according to claim 1, wherein the liquid landing position moving step includes a low surface tension liquid inclined discharge step of discharging the low surface tension liquid from a low surface tension liquid nozzle along an inclined direction that is inclined with respect to the vertical direction so as to approach the peripheral edge of the upper surface of the substrate as the inclined direction goes downward, and a low surface tension liquid nozzle moving step of moving the liquid landing position by moving the low surface tension liquid nozzle toward the peripheral edge of the substrate.

9. The substrate processing method according to claim 1, wherein the liquid landing position moving step includes a movement decelerating step of decelerating movement of the liquid landing position such that a movement speed of the liquid landing position when the peripheral edge of the opening is positioned in the peripheral edge region of the upper surface of the substrate is lower than the movement speed of the liquid landing position when the peripheral edge of the opening is positioned in the center region of the upper surface of the substrate.

10. The substrate processing method according to claim 5, wherein the rotation deceleration step includes a step of decelerating rotation of the substrate such that the rotational speed of the substrate decreases as the peripheral edge of the opening moves toward the peripheral edge of the upper surface of the substrate.

* * * * *